United States Patent [19]
Ikeda et al.

[11] Patent Number: 5,846,845
[45] Date of Patent: Dec. 8, 1998

[54] LC ELEMENT MANUFACTURING METHOD

[75] Inventors: Takeshi Ikeda; Tsutomu Nakanishi, both of Tokyo; Akira Okamoto, Ageo, all of Japan

[73] Assignee: T.I.F. Co., Ltd., Tokyo, Japan

[21] Appl. No.: 476,276

[22] Filed: Jun. 7, 1995

Related U.S. Application Data

[62] Division of Ser. No. 282,046, Jul. 22, 1994, Pat. No. 5,500,552.

[30] Foreign Application Priority Data

| Jul. 26, 1993 | [JP] | Japan | 5-203623 |
| Oct. 29, 1993 | [JP] | Japan | 5-294282 |
| Dec. 10, 1993 | [JP] | Japan | 5-341476 |
| May 24, 1994 | [JP] | Japan | 6-133639 |

[51] Int. Cl.⁶ .................................................. H01L 21/77
[52] U.S. Cl. ........................ 437/40 GS; 437/47; 437/60
[58] Field of Search .................. 437/40 GS, 41 GS, 437/60, 919, 47, 54; 148/DIG. 14

[56] References Cited

U.S. PATENT DOCUMENTS

| 3,504,430 | 4/1970 | Kubo | 437/919 |
| 4,720,467 | 1/1988 | Muggli et al. | 437/919 |
| 4,819,047 | 4/1989 | Gilfeather et al. | 257/357 |
| 5,136,357 | 8/1992 | Hesson et al. | 257/532 |
| 5,227,659 | 7/1993 | Hubbard | 257/531 |
| 5,370,766 | 12/1994 | Desaigoudar et al. | 437/180 |

FOREIGN PATENT DOCUMENTS

| 0133799 | 3/1985 | European Pat. Off. . |
| 0230154 | 7/1987 | European Pat. Off. . |
| 0596721 | 5/1994 | European Pat. Off. . |
| 2509093 | 1/1983 | France . |
| 4223937 | 2/1993 | Germany . |
| 59-04144 | 1/1984 | Japan | 148/DIG. 14 |
| 2106064 | 4/1990 | Japan | 437/919 |
| 3190302 | 8/1991 | Japan | 148/DIG. 14 |
| 3-259608 | 11/1991 | Japan . |
| 4326607 | 11/1992 | Japan . |

*Primary Examiner*—Michael Trinh
*Attorney, Agent, or Firm*—Oliff & Berridge, P.L.C.

[57] ABSTRACT

An LC element, semiconductor device and a manufacturing method thereof whereby a channel 22 is formed by applying a voltage to a gate electrode 10 having a predetermined shape formed on a p-Si substrate 30 via an insulation layer 26, whereby a connection is formed between a first diffusion region 12 and a second diffusion region 14 formed at separated positions near the surface of the p-Si substrate 30; both the channel 22 gate electrode 10 function as inductors, and between these a distributed constant type capacitor is formed, and possessing excellent attenuation characteristics over a wide band. This LC element and semiconductor device can be easily manufactured by using MOS manufacturing technology; in the case of manufacturing as a portion of a semiconductor substrate, component assembly work in subsequent processing can be omitted. Also these can be formed as a portion of an IC or LSI device.

5 Claims, 34 Drawing Sheets

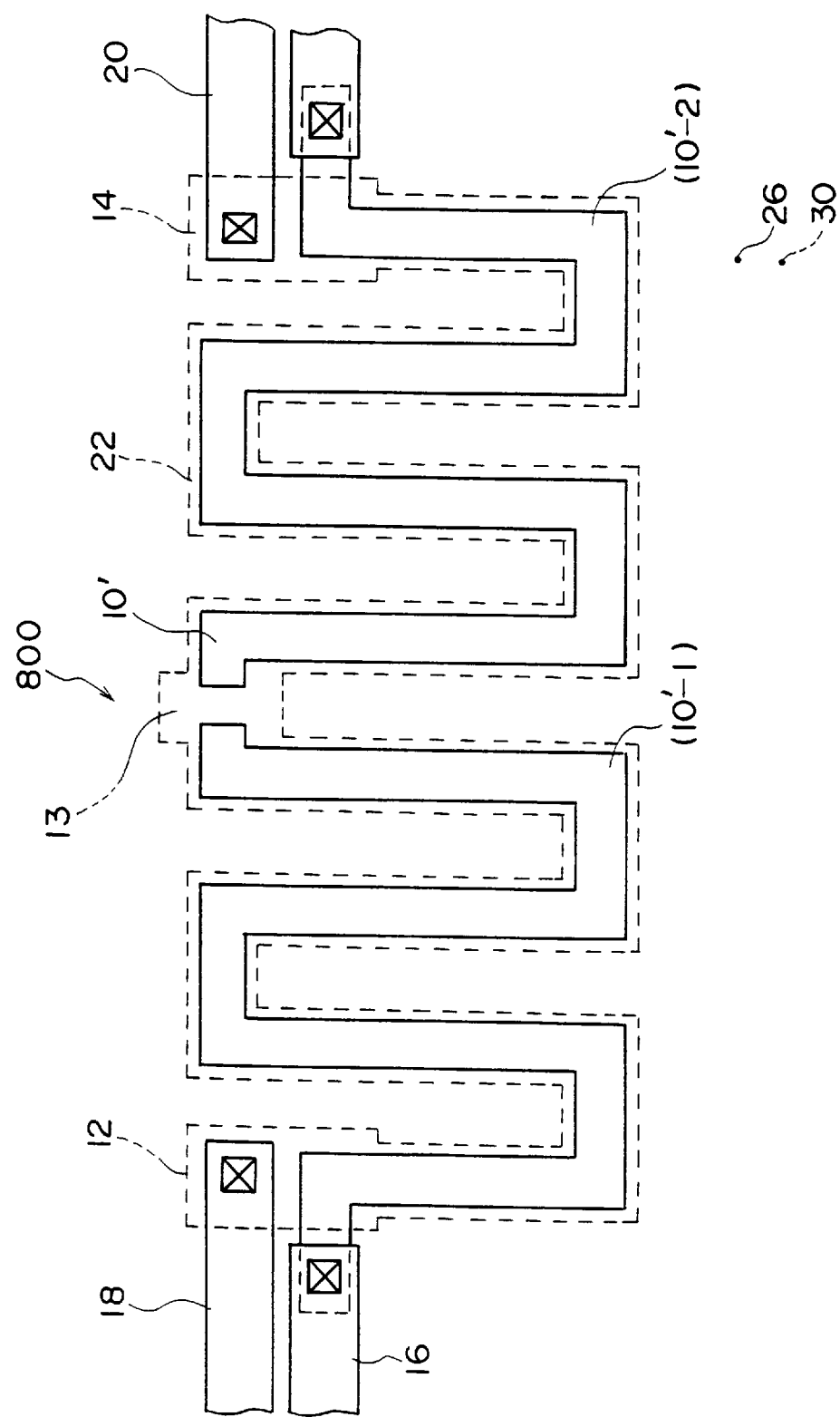

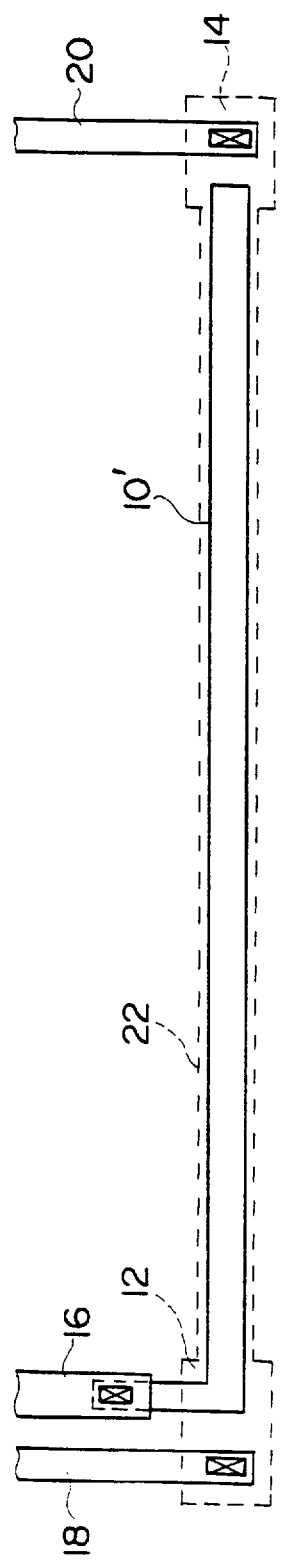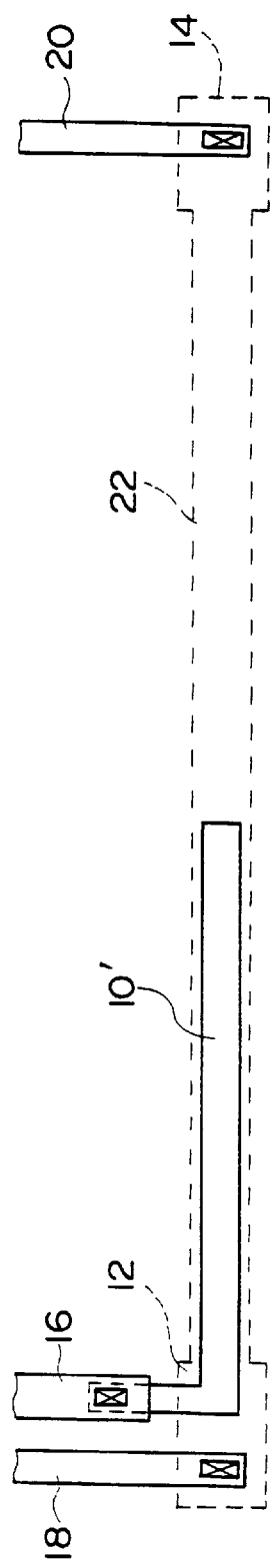

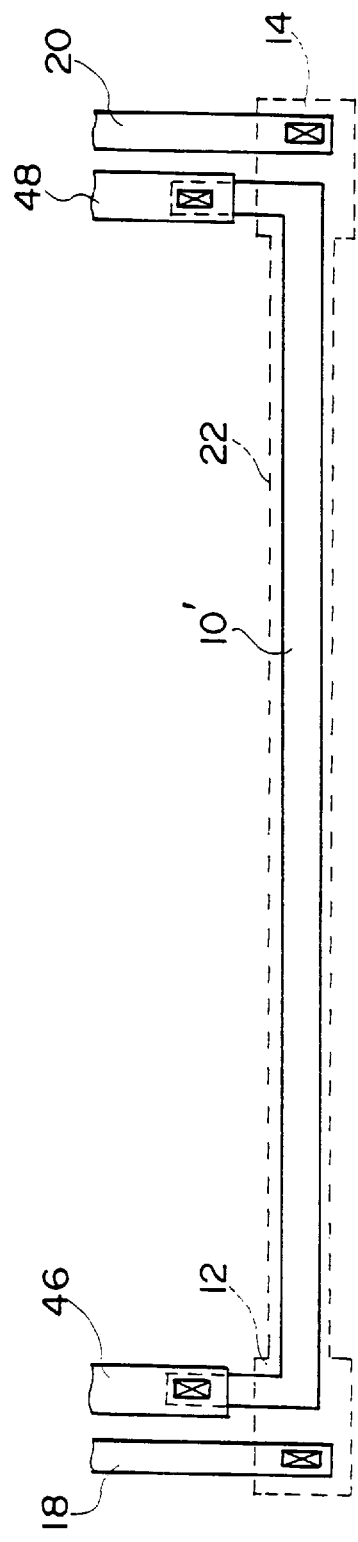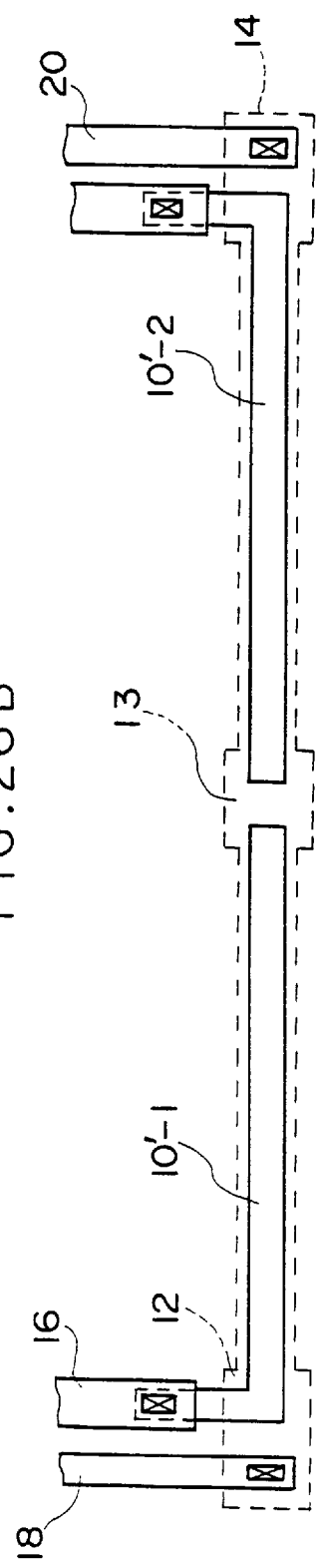

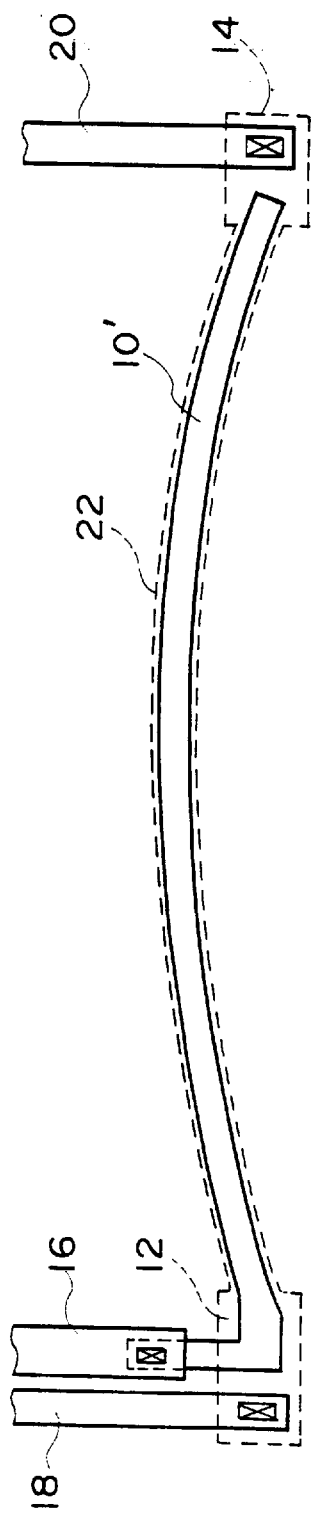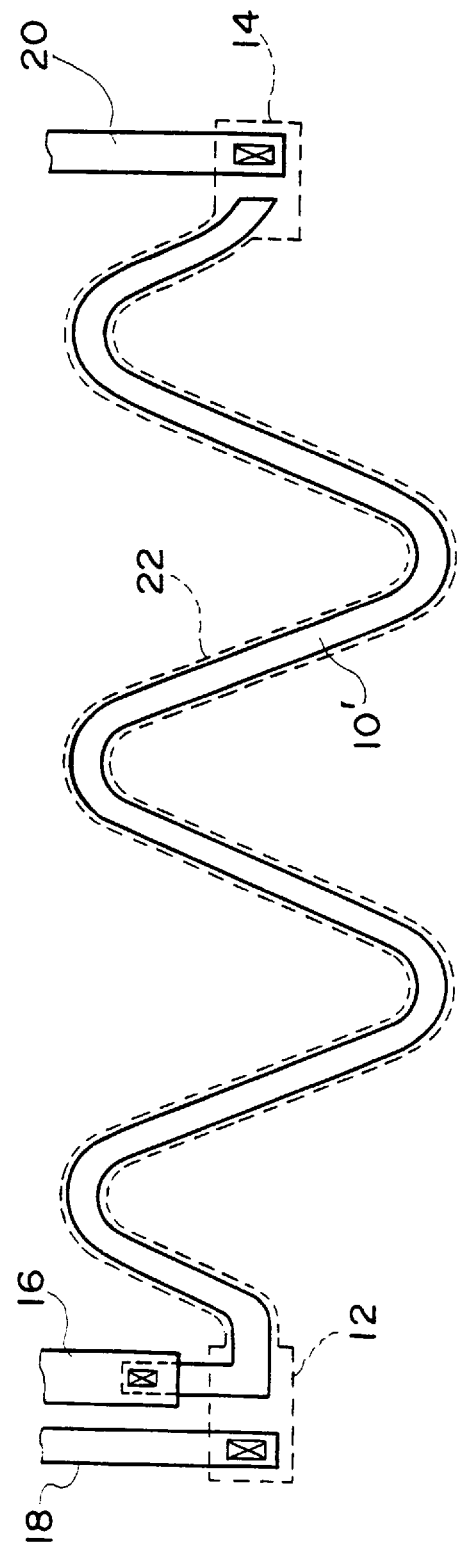

LC ELEMENT MANUFACTURING METHOD

This is a Division of application Ser. No. 08/282,046 filed Jul. 22, 1994, U.S. Pat. No. 5,500,552.

BACKGROUND OF THE INVENTION

1. Field of the Invention

The present invention relates to an inductance-capacitance (LC) element capable of attenuating a predetermined frequency band and used either as part of a semiconductor or other device, or as a discrete element, and a method for manufacturing such a semiconductor device and LC element.

2. Background Art

The rapid advancement of electronics technology in recent years has brought about the use of electronic circuits in an increasingly broad range of fields. Therefore, stable operation of these electronic circuits is sought without being affected by external conditions.

However, these types of electronic circuits are directly or intermittently subject to the incursion of external noise. Consequently, a problem exists whereby operating error is caused in electronic products using these electronic circuits in not a few cases.

In particular, there are many cases of using switching regulators as electronic circuit DC power supplies. As a result of transient current produced by such operations as switching, and by load fluctuations arising from switching operation of utilized digital ICs, noise having many frequency components is often produced in the switching regulator power supply line. This noise is conveyed via the power supply line or by radiation to other circuits in the same product, giving rise to such effects as operating error and impaired signal to noise ratio, and in some cases even causing operating error in other nearby electronic products.

Various types of noise filters are presently being used with respect to electronic circuits in order to remove this type of noise. In particular, since a great many electronic products of numerous types have come into use in recent years, the restrictions in regard to noise have grown ever more severe, and development of an LC element having functions as a compact high performance noise filter capable of reliably removing such noise is desired.

One example of this type of LC element is an LC noise filter disclosed in Japanese Patent Application Laid-Open No.3-259608. In the case of this LC noise filter, the L and C components exist as distributed constants, and compared to an integrated constant type LC filter, favorable attenuation response can be obtained over a relatively wide band.

However, this LC filter comprises a capacitor type conductor formed on one surface of an insulation sheet and an inductor type conductor formed on the other surface. Manufacturing the filter involves folding over this insulator sheet, which is among the processes that add to manufacturing complexity.

Also, wiring is required when directly inserting this LC filter into an IC or LSI power supply or signal line, thus necessitating time and labor for installing the components. In addition, since this LC filter is formed as a discrete component, inclusion in an IC or LSI circuit, i.e., insertion into the internal wiring of an IC, LSI or other device is nearly impossible.

SUMMARY OF THE INVENTION

The present invention considers the above mentioned points and the objects are to enable simplified manufacturing by utilizing semiconductor manufacturing technology, to eliminate the parts assembly operations in subsequent processing, and to provide an LC element, semiconductor device and LC element manufacturing method allowing the formation of the LC element as part of an IC or LSI device.

In order to resolve the above mentioned problems, an LC element in accordance with this invention comprises:

- a gate electrode having a predetermined shape formed on a semiconductor substrate,
- an insulation layer formed between the gate electrode and semiconductor substrate,
- a first diffusion region formed near one end of a channel formed with respect to the gate electrode in the semiconductor substrate, and
- a second diffusion region formed near the other end of the channel in the semiconductor substrate.

The gate electrode and channel function as inductors, while a distributed constant type capacitance exists between the gate electrode inductance and channel inductance, and at a minimum, the channel is used as a signal transmission line.

In constructing the LC element of the present invention, the insulation layer is formed on the semiconductor substrate and the gate electrode having a predetermined shape is formed over this. An MOS structure is thus comprised by the gate electrode, insulation layer and semiconductor substrate. Examples of gate electrode shapes in accordance with this invention are spiral, meander, curved line, and in the case of high frequency use, straight line and others.

The gate electrode and channel formed in correspondence thereof respectively function as inductors. Also, the insulation layer is interposed between the gate electrode and channel, thereby forming a capacitor. In addition, this capacitor is formed in a manner of a distributed constant over the length of the gate electrode and channel. For this reason, an LC element is formed possessing excellent attenuation response over a wide band. An input signal applied to the first or second diffusion region formed at one end of the channel has frequency components such as noise in the attenuation band to be removed as it is transferred via the distributed constant type inductor and capacitor.

In particular, because the LC element in accordance with this invention can be constructed in a manner whereby in addition to forming the first and second diffusion regions in the semiconductor substrate, the insulation layer and gate electrode with predetermined shape are formed on the surface, manufacturing is extremely easy. Also, since this LC element is formed on a semiconductor substrate, formation as part of an IC or LSI device is also possible, and when formed as part of this type of device, part assembly work in subsequent processing can be eliminated.

Also for the purpose of resolving the above mentioned problems, another LC element in accordance with this invention comprises:

- a gate electrode having a predetermined shape formed on a semiconductor substrate,
- an insulation layer formed between the gate electrode and semiconductor substrate, and
- a diffusion region formed near one end of a channel formed in correspondence to the gate electrode. This LC element is characterized by the following points.

The gate electrode and channel function as inductors, a distributed constant type capacitance exists between the gate electrode inductance and channel inductance and the gate electrode is used as a signal transmission line.

In the case of an LC element in accordance with another aspect of this invention, in contrast with an LC element using the channel as the signal transmission line as in the foregoing aspect, the gate electrode is used as the signal transmission line, and since the signal is not transmitted via the channel, either one of the diffusion regions can be omitted.

Consequently, in addition to the channel and gate electrode with predetermined shape respectively functioning as inductors, a distributed constant type capacitor is formed between these, and an LC element is comprised with excellent attenuation characteristics over a wide band. Also, construction is easy and in the same manner as the above mentioned LC element, formation as a part of a substrate is enabled.

An LC element in accordance with another aspect of this invention comprises:

a first input/output electrode electrically connected with a first diffusion region, a second input/output electrode electrically connected with a second diffusion region, and a ground electrode electrically connected near one end of a gate electrode. This LC element is characterized by the following points.

When an input signal is applied to either the first or second input/output electrode, the signal output is obtained from the other electrode. The ground electrode is connected to either a fixed potential power supply or the ground.

In the case of an LC element in accordance with this aspect of the invention, the first and second input/output electrodes are connected to the first and second diffusion regions near one end and the other end, respectively, of the channel formed in correspondence to the gate electrode, and by providing the ground electrode in proximity with one end of the gate electrode, a three-terminal type LC element can be formed whereby the channel is used as the signal transmission line.

In the case of an LC element in accordance with another aspect of this invention, the input/output electrodes and ground electrode are interchanged. Therefore, together with providing the first and second input/output electrodes near one end and the other end, respectively, of the gate electrode having a predetermined shape, by providing the ground electrode connected to the diffusion region formed at one end of the channel, a three-terminal type LC element can be easily constructed wherein the gate electrode having a predetermined shape is used as the signal transmission line.

An LC element in accordance with another aspect of this invention comprises:

a first input/output electrode electrically connected to a first diffusion region, a second input/output electrode electrically connected to a second diffusion region, a third input/output electrode electrically connected near one end of the gate electrode and a fourth input/output electrode electrically connected near the other end of the gate electrode, and is characterized by:

usage as a common mode type element is enabled whereby both the channel and gate electrode comprise signal transmission lines.

In the case of an LC element in accordance with this aspect, in addition to providing the first and second input/output electrodes near one end and the other end, respectively, of the gate electrode having a predetermined shape, by providing third and fourth input/output electrodes in the first and second diffusion regions formed near one end and the other end, respectively, of the channel corresponding to the gate electrode, a four-terminal common mode type LC element can be easily constructed.

Another semiconductor device in accordance with this invention is characterized by a buffer connected in one diffusion region of the above mentioned LC element for amplifying the signal output via the channel.

As for the aforementioned LC element, the signal passes through the channel having relatively large resistance, compared to a metal material such as aluminum, and the voltage level is attenuated. In the case of this semiconductor device, the buffer is therefore connected for amplifying the signal output via the LC element channel for restoring the original signal with excellent signal to noise ratio.

Another LC element in accordance with this invention is characterized by providing variable gate voltage applied to the gate electrode, thereby varying the width and depth of the channel formed in correspondence to the gate electrode, and as a result, the channel resistance is varied. Consequently, by varying the gate voltage, the overall attenuation, i.e., frequency response, can be variably controlled according to requirements.

Another LC element in accordance with this invention is characterized by injecting carriers beforehand at a position corresponding to the gate electrode in the semiconductor substrate surface of the above-mentioned LC elements.

In the case of these LC elements, carriers are injected beforehand at a position corresponding to the gate electrode to comprise a depletion type element. In this case, without changing the characteristics of the LC element itself, the channel can be formed without applying gate voltage, or the gate voltage and channel width and depth etc., can be made to differ during channel formation in the state where gate voltage is applied, from the case when carriers are not injected.

Another LC element in accordance with this invention is characterized by injecting carriers at a minimum of one portion of the channel formation position of the semiconductor substrate surface. Together with providing a longer or shorter length of the channel corresponding to the gate electrode, partial correspondence can be provided between the gate electrode and channel.

In the case of this LC element, either the gate electrode or the channel is shorter. In this case as well, the different length gate electrode and channel respectively function as inductors, and the insulation layer is interposed between these to form a distributed constant type capacitor. Consequently, an LC element is comprised having advantages of excellent attenuation response over a wide band, while manufacturing is easy and the LC element can be formed as a portion of a substrate.

However, in cases when the overall semiconductor substrate is formed in the same condition, since the channel is formed in correspondence to the overall length of the gate electrode, the channel needs to be shortened by injecting carriers beforehand into a portion of the channel or by severing a portion of the channel by etching or other means.

Another semiconductor device in accordance with this invention is characterized by unitized formation whereby each the above mentioned LC elements is formed as a portion of a substrate, and at least one of either the gate electrode or channel formed in correspondence thereto is inserted into a signal line or power supply line.

Since the LC element in accordance with this invention can be manufactured in unitized manner with other components on the semiconductor substrate, this semiconductor device is easy to manufacture, and parts assembly work in subsequent processing is unnecessary.

Another LC element in accordance with this invention is characterized by providing a protector circuit in either the operating power supply line or ground line of each of the above mentioned LC elements for bypassing excess voltage applied to the gate electrode.

This semiconductor device has the protector circuit connected to the gate electrode. Consequently, even in event excess voltage due to static electricity or other cause is applied with respect to the gate electrode, since bypass current flows in the operating power supply line or ground line, insulation breakdown between the gate electrode and semiconductor substrate can be prevented.

One manufacturing method of an LC element in accordance with this invention is characterized by:

a first process whereby impurities are injected partially into the substrate to form the first and second diffusion regions, a second process whereby the insulation layer is formed completely or partially on the substrate, a third process whereby the first and second diffusion regions are joined on the surface of the insulation later to form the gate electrode with predetermined shape, and a fourth process whereby a wiring layer is formed connected electrically to the first and second diffusion regions respectively.

Another manufacturing method of an LC element in accordance with this invention is characterized by:

a first process whereby injecting impurities partially into the substrate to form a diffusion region, a second process whereby the insulation layer is formed completely or partially on the substrate, a third process whereby a gate electrode with predetermined shape is formed on the surface of the insulation layer with one end of the electrode positioned above the diffusion region, and a fourth process whereby a wiring layer is formed connected electrically to the diffusion region.

The above two LC element manufacturing methods are applicable to the semiconductor manufacturing technology of the above mentioned LC elements. In other words, the first process forms either or both the first and second diffusion layers, the second process forms the insulation layer on the semiconductor substrate surface, and the third process forms the gate electrode with predetermined shape. Then in the fourth process, the wiring layer including input/output electrodes etc. is formed to complete the above mentioned LC element.

In this manner, the above mentioned LC elements can be manufactured by utilizing ordinary semiconductor manufacturing technology (particularly MOS manufacturing technology). In addition to enabling down-sizing and cost reduction, a plurality of individual LC elements can be mass produced simultaneously.

DESCRIPTION OF THE DRAWINGS

FIG. 24 is a plan view of an LC element in accordance with an eighth embodiment of this invention;

FIGS. 25A and 25B are plan views of three-terminal type LC elements having straight shaped gate electrodes;

FIGS. 26A and 26B are plan views of common mode type LC elements having straight shaped gate electrodes;

FIGS. 27A and 27B are plan views of LC elements respectively having arc and sinusoidal shaped gate electrodes;

DETAILED DESCRIPTION OF THE INVENTION

Following is a description of the preferred embodiments of the LC elements in accordance with this invention with reference to the attached drawings. Since the construction of the LC elements in accordance with this invention correspond to MOSFET, terminology related to a field effect transistor is used in the following description, e.g., one diffusion region is termed the source, the other diffusion region is termed the drain, and the gate electrode is termed the gate, respectively.

FIRST EMBODIMENT

Figure 1:
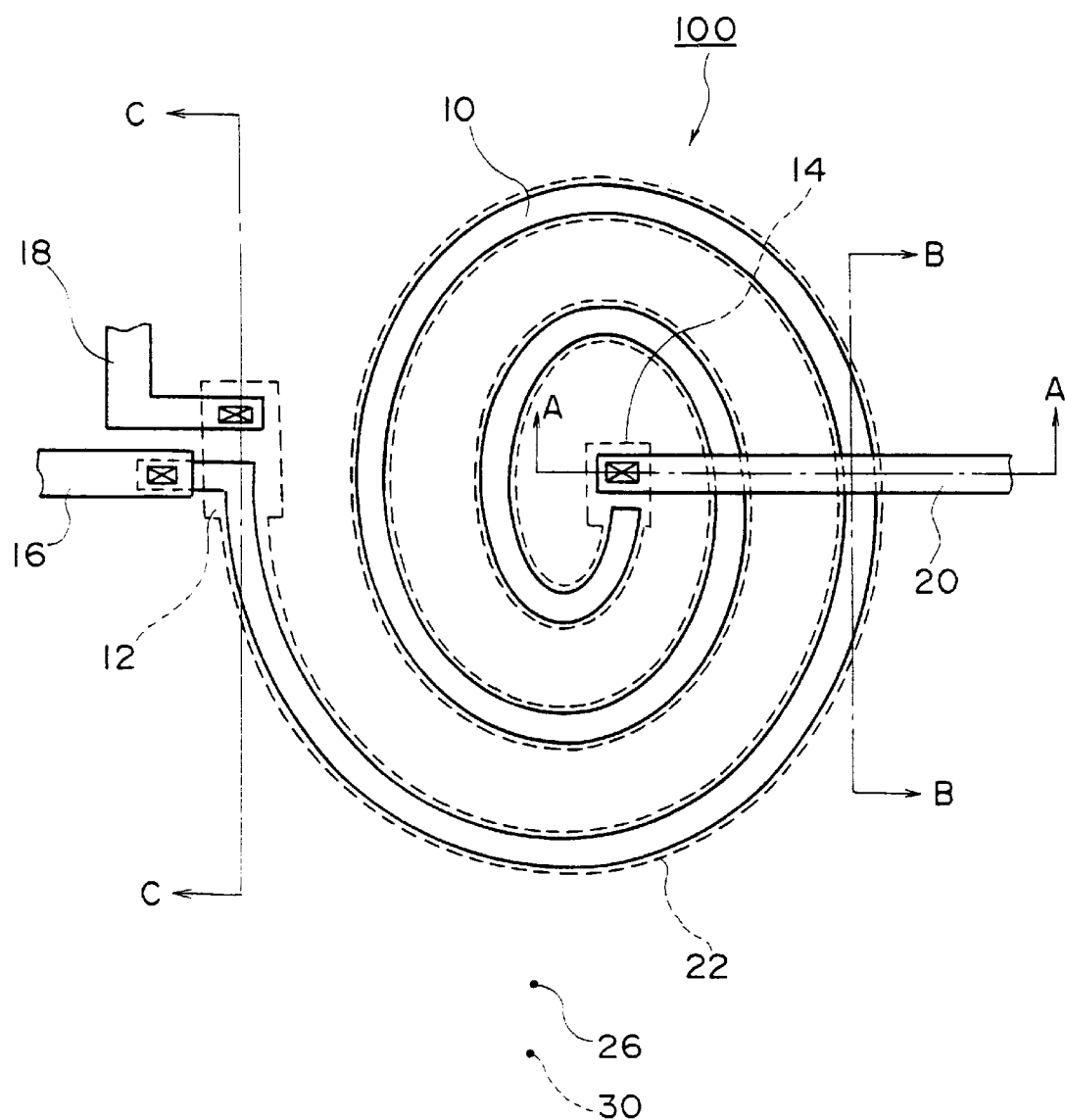
FIG. 1 is a plan view of an LC element in accordance with a first embodiment of this invention.
Figure 2:
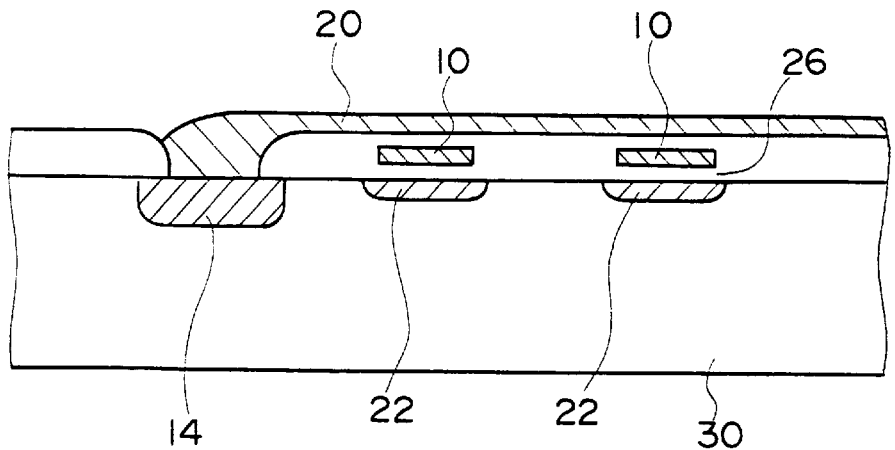
FIG. 2 is an enlarged cross-sectional view viewed along line A—A in FIG. 1.
Figure 3:
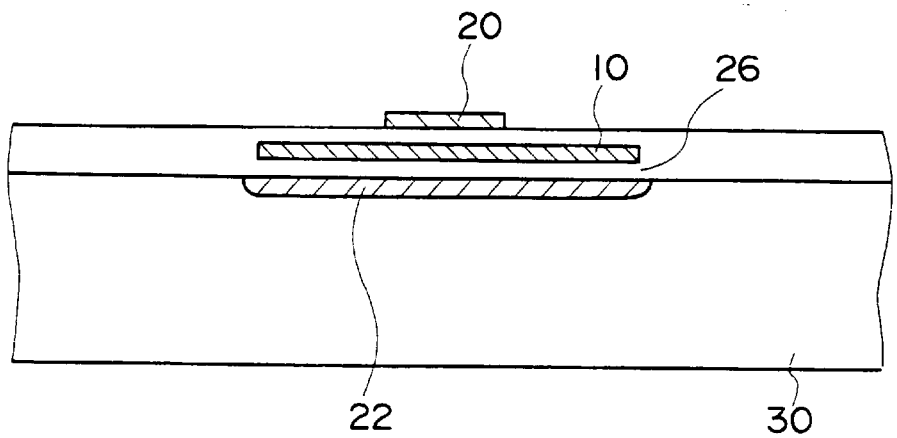
FIG. 3 is an enlarged cross-sectional view viewed along line B—B in FIG. 1.
Figure 4:
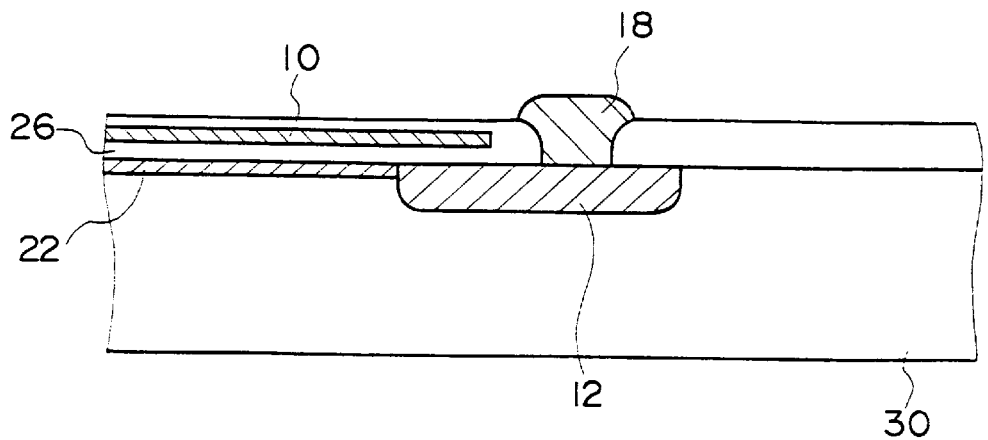
FIG. 4 is an enlarged cross-sectional view viewed along line C—C in FIG. 1.

FIG. 1 is a plan view of a spiral shaped LC element in accordance with a first embodiment of this invention. FIGS. 2, 3 and 4 are enlarged cross-sectional views viewed along lines A—A, B—B and C—C in FIG.1, respectively.

As indicated in these figures, the LC element 100 of this embodiment is formed at a position near the surface of a semiconductor substrate 30 comprising p-type silicon (p-Si), and comprises a spiral shaped electrode 10 functioning as a gate between a source 12 diffusion region and a drain 14 diffusion region and connected by a channel 22 formed by applying a voltage with respect thereto.

The source 12 and drain 14 are formed as p-Si substrate 30 inverted $n^+$ diffusion regions. For example, these can be formed by raising the impurity density by injecting $As^+$ ions by thermal diffusion or ion implanting.

Also, the spiral shaped gate electrode 10 is formed on an insulation layer 26 formed in the p-Si substrate 30 surface in a manner whereby one end overlaps the source 12 and the other end overlaps the drain 14. The spiral shaped gate electrode 10 is formed of aluminum, copper, gold silver or other thin film, or by large P doping by diffusion or ion injection.

Also, the insulation layer 26 at the P-Si substrate 30 surface serves to insulate the P-Si substrate 30 surface and the spiral shaped gate electrode 10, and has the function of a gate film in regard to MOSFET. The entire surface (or at minimum a portion corresponding to the spiral shaped gate electrode 10) is covered by this insulation layer 26. In addition, the spiral shaped gate electrode 10 is formed on the surface of this insulation layer 26. The insulation layer 26 is formed, for example, of P added $SiO_2$ (P-glass).

Figure 10:
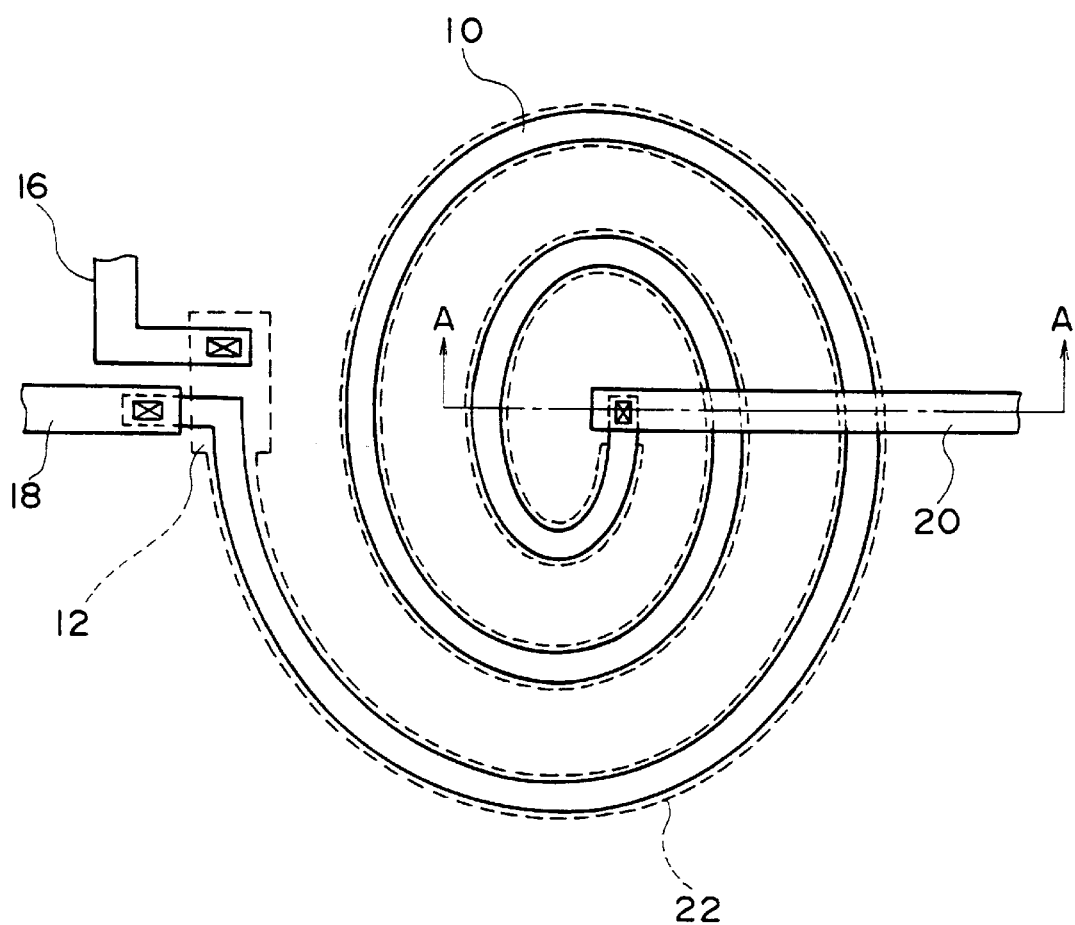
FIG. 10 indicates an example of a variation of an LC element in accordance with the first embodiment.

The spiral shaped gate electrode 10, source 12 and drain 14 are respectively connected to a ground electrode 16 and input/output electrodes 18 and 20, as indicated in FIGS. 1–4. The ground electrode 16 attachment to the spiral shaped gate electrode 10 is performed external to the active region in order not to damage the thin gate film, as indicated in FIG. 10.

As indicated in FIG. 2 or FIG. 4, after exposing part of the source 12 and drain 14, input/output electrode 18 attachment to the source 12, and input/output electrode 20 attachment to the drain 14 are performed by applying aluminum, copper, gold, silver or other metal film. Also, as indicated in FIG. 2, the input/output electrode 20 connected to the drain 14 positioned at essentially the center portion of the spiral is extended to the external circumference so as to maintain the insulation status of each turn portion of the spiral shaped gate electrode 10.

By utilizing an n-channel enhancement type construction for an LC element having the above-mentioned construction in accordance with this embodiment, when a relatively positive voltage is applied to the spiral shaped gate electrode 10, an n-type channel 22 is first formed. Then, while this channel 22 and the spiral shaped gate electrode 10 respectively function as spiral shaped inductor elements, a distributed constant type capacitor is formed between this channel 22 and spiral shaped gate electrode 10.

Figure 5A:
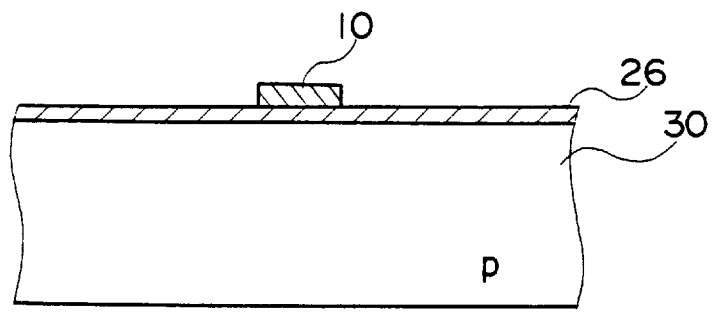
FIGS. 5A and 5B indicate states when the channel is formed.
Figure 5B:
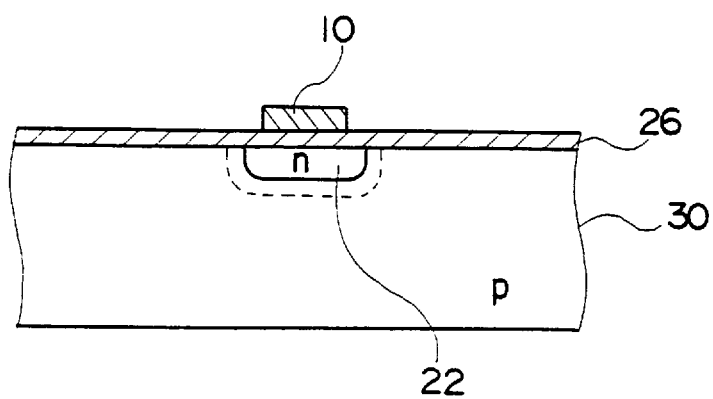

FIGS. 5A and 5B are cross-sectional drawings indicating the channel 22 forming state. The cross-sectional view is perpendicular to the long direction of the spiral shaped gate electrode 10. As indicated in FIG. 5A, in the state where positive gate voltage is not applied to the ground electrode 16 connected to the spiral shaped gate electrode 10, the channel 22 does not appear in the p-Si substrate 30 surface. Consequently, in this state, the source 12 and drain 14 indicated in FIG. 1 are insulated.

Conversely, when a positive gate voltage is applied with respect to the spiral shaped gate electrode 10, the channel 22 comprising an n region appears near the surface of the p-Si substrate 30 corresponding to the spiral shaped gate electrode 10, as indicated in FIG. 5B. Since this channel 22 is formed over the entire length of the spiral shaped gate electrode 10, charges are stored in the channel 22 and spiral shaped gate electrode 10 respectively, to form a distributed constant type capacitor between these.

Figure 6:
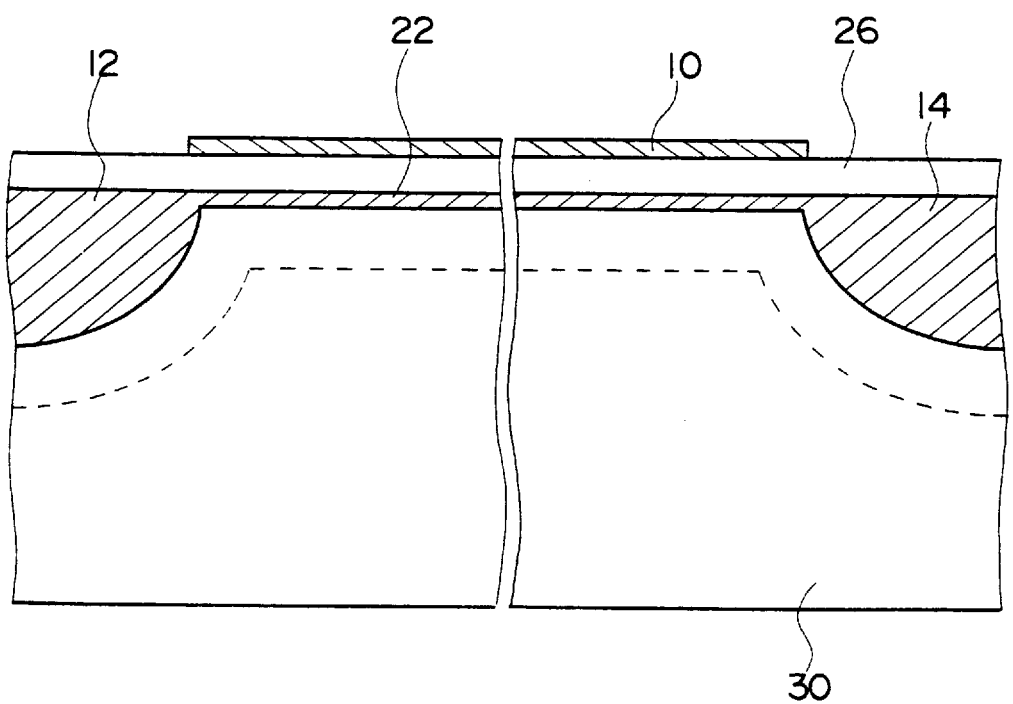
FIG. 6 is a longitudinal sectional view along gate electrode of a spiral shaped gate electrode of an LC element in accordance with the first embodiment.

FIG. 6 shows the cross-sectional construction of an LC element 100 according to this embodiment and indicates a view along the longitudinal direction of the spiral shaped gate electrode 10. As indicated in the figure, the channel 22 is formed in parallel with the spiral shaped gate electrode 10, and by this channel 22, a conducting state is produced between the source 12 and drain 14. For example, in the case of enhancement type, in a state when a predetermined gate voltage is applied to the spiral shaped gate electrode 10, this channel 22 is first formed and the conducting state is produced between the source 12 and drain 14. By changing the gate voltage applied to the spiral shaped gate electrode 10, since the channel 22 width and depth are changed, the resistance value between the source 12 and drain 14 can be changed.

In practice, the gate voltage applied to the spiral shaped gate electrode 10 via the ground electrode 16 in FIG. 6 is relative to the substrate 30. Particularly, in the LC element 100 of this embodiment, the long spiral shaped gate electrode 10 functions as a gate and the channel 22 needs to be precisely formed throughout the entire length of this spiral shaped gate electrode 10. For example, merely providing a predetermined potential difference corresponding to the gate voltage between the ground electrode 16 connected to one end of the spiral shaped gate electrode 10 and source 12 is inadequate, as there is risk the channel 22 will not be formed in proximity to the drain 14. For this reason, a predetermined gate voltage needs to be applied between the spiral shaped gate electrode 10 and the substrate 30 at proximity position to the spiral shaped gate electrode 10. Also, most desirable is to form an electrode on the complete surface of the p-Si substrate 30 (bottom surface of the p-Si substrate 30 indicated in FIG. 6) and provide a predetermined potential difference between this electrode and the ground electrode 16.

Figure 7A:
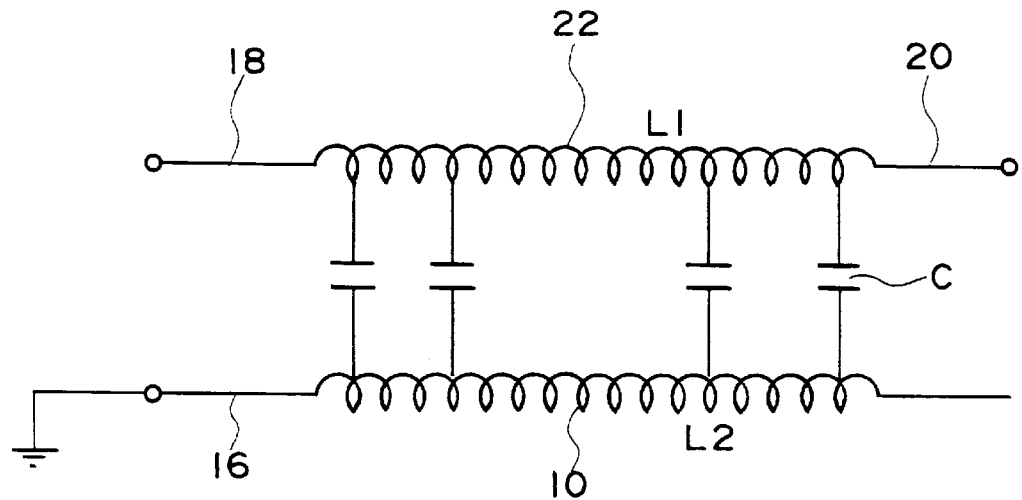
FIGS. 7A and 7B are schematic diagrams indicating equivalent circuits of LC elements in accordance with the first embodiment.
Figure 7B:
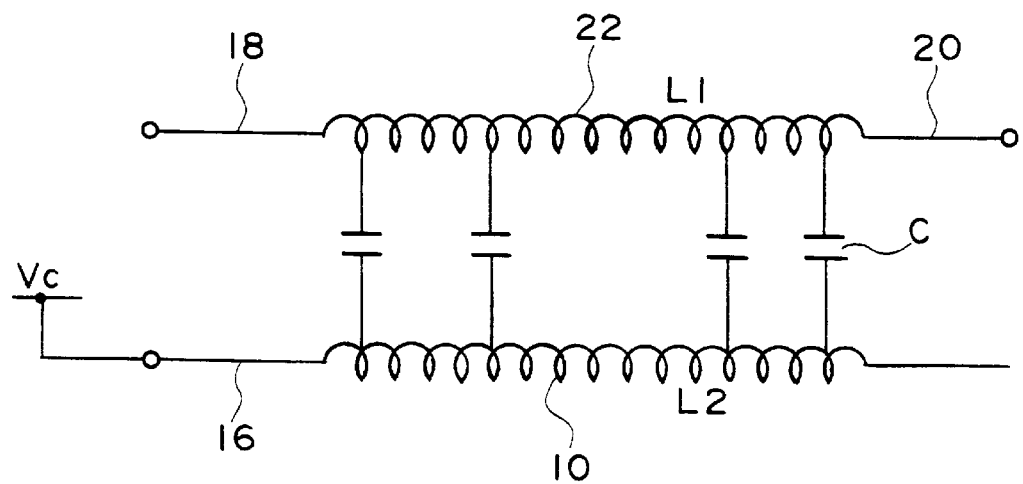

FIGS. 7A and 7B indicate equivalent circuits of LC elements in accordance with the first embodiment. The FIG. 7A circuit indicates a case when the channel 22 provided with input/output electrodes 18 and 20 is used as the signal transmission line and at the same time, the ground electrode 16 provided in proximity to one end of the spiral shaped gate electrode 10 is grounded, and thus the circuit functions as a three-terminal type LC element.

In this case, since the ground electrode 16 is grounded, the voltage level of the input/output signals via the input/output electrodes 18 and 20, and the voltage level applied to the p-Si substrate 30 must be kept negative. By performing in this manner, a relatively positive gate voltage becomes applied to the spiral shaped gate electrode 10, while there is no cutting of the channel 22 in proximity to the source 12 and drain 14.

By adopting a depletion type construction whereby n type carriers are injected beforehand at the channel 22 forming position, even when the signal voltage level via the input/output electrodes 18 and 20 is positive, the channel 22 can be formed.

Regarding an LC element of this embodiment having this type of equivalent circuit, the channel 22 comprising the signal transmission line is formed in a spiral shape, and thus functions as an inductor having inductance L1. In the same manner, since the spiral shaped gate electrode 10 is also formed in a spiral shape, this functions as an inductor having inductance L2. Also, since these two inductors are arranged astride the insulation layer 26, a distributed constant type capacitor having a predetermined capacitance C is formed by the channel 22 and spiral shaped gate electrode 10.

Consequently, distributed constant type inductance and capacitance exist in the LC element 100 of this embodiment. Superb attenuation characteristics can therefore be realized that are unattainable with a conventional concentrated constant type element. From an input signal applied via either input/output electrode 18 or 20, an output with only the predetermined frequency components removed can be obtained from the other of these electrodes. In particular, in the case of the LC element 100 of this embodiment, the spiral shaped gate electrode 10 and the corresponding channel 22 are formed in a spiral shape, and also formed so as the diameter of each circumference portion varies continuously in succession. For this reason, the attenuation characteristics (insertion loss characteristic of a signal transferred via the channel 22) determined by the distributed constant type inductor and capacitor is such that attenuates signal over a wide band. Therefore, this LC element 100 is effective for removing frequency components such as noise in the attenuation band.

FIG. 7B indicates an equivalent circuit when a variable control voltage Vc is applied with respect to the ground electrode 16. By changing the control voltage Vc applied to the ground electrode 16, since the channel 22 depth is changed, the mobility with respect to the channel 22 is changed, and as a result the channel 22 resistance can be changed as desired.

Consequently, the respective inductance of the channel 22 and spiral shaped gate electrode 10, and the capacitance of the distributed constant type capacitor formed between these are changed. In addition, the overall attenuation characteristics of the LC element 100 determined by the resistance of the channel 22 are varied. In other words, by varying this control voltage Vc, the characteristics of the LC element 100 of this embodiment can be varied as desired within a certain range.

The above description of the LC element 100 is related to the case where an n channel is formed between the source 12 and drain 14. In this case, since electrons are used as carriers, the mobility is large and the channel 22 resistance is comparatively small. In contrast to this, it is also acceptable to form a p channel on an n type silicon (n-Si) substrate. In this latter case, since holes are used for carriers, the channel 22 resistance becomes comparatively large and different characteristics are possessed compared to the above mentioned n channel case.

Figure 8A:
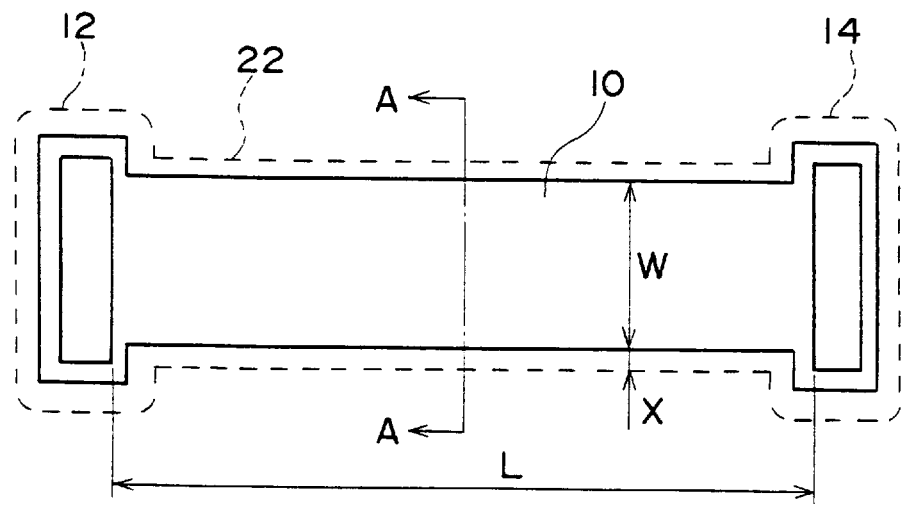
FIGS. 8A and 8B are descriptive drawings for describing the channel resistance value.
Figure 8B:
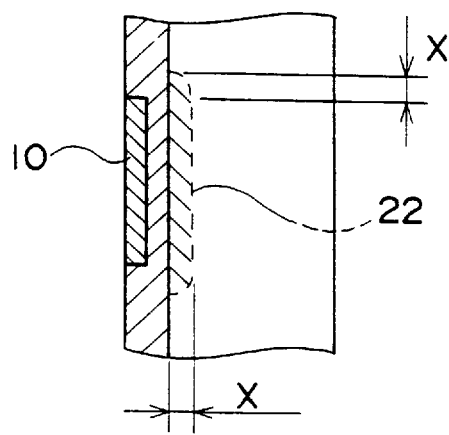

FIGS. 8A and 8B are drawings for describing the channel resistance R in a case when the gate voltage (control voltage Vc) applied to the spiral shaped gate electrode 10 is varied to change the channel 22 depth and other qualities. FIG. 8A, is a plan view where the actually spiral shaped gate electrode 10 is rendered as a straight shape for the sake of description. FIG. 8B is a cross-sectional view along line A—A in FIG. 8A.

In FIGS. 8A and 8B, W is the gate width, and X is the channel depth. In this manner, when the channel 22 is formed by the spiral shaped gate electrode 10 of width W, the width of this channel 22 becomes (W+2X). Consequently, the resistance R of the channel 22 between the source 12 and drain 14 can be computed as follows.

$$R = pL/(W+2X)$$

In the above, p is the resistance per unit area of the channel 22 having depth X; and channel resistance R is proportional to the channel length L and inversely proportional to the channel width (W+2X).

Following is a description of a manufacturing process for the LC element 100 in accordance with this embodiment.

FIGS. 9A–9G indicate an example of a manufacturing process for an enhancement type LC element 100. The figures show cross sections of the spiral shaped gate electrode 10 viewed in the longitudinal direction.

Figure 9A:
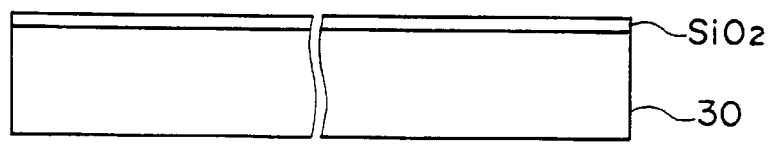
FIGS. 9A–9G indicate an example of a manufacturing process for an LC element in accordance with the first embodiment.

(1) Oxidized film formation:

First, silicon dioxide $SiO_2$ is formed on the p-Si substrate 30 surface by thermal oxidation (FIG. 9A).

Figure 9B:
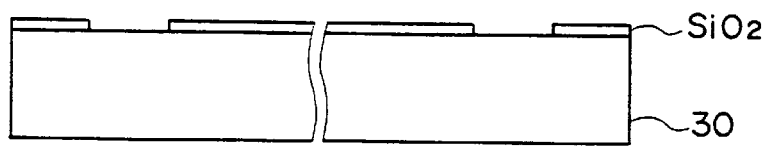

(2) opening source and drain windows:

Portions corresponding to the source 12 and drain 14 are opened by photo-etching the oxidized film on the p-Si substrate 30 surface (FIG. 9B).

Figure 9C:
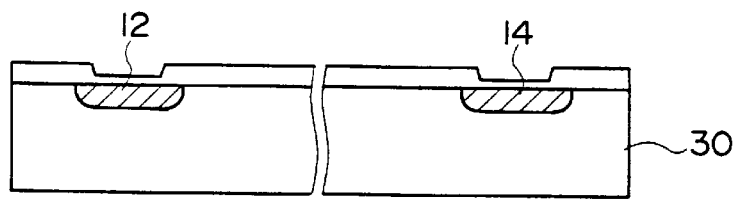

(3) Source and drain formation:

The source 12 and drain 14 are formed by injecting n type impurities into the opened portions (FIG. 9C). For example, $As^+$ is used as n type impurities and injected by thermal diffusion. If the impurities are injected by ion implantation, the window opening of FIG. 9B is not required.

Figure 9D:
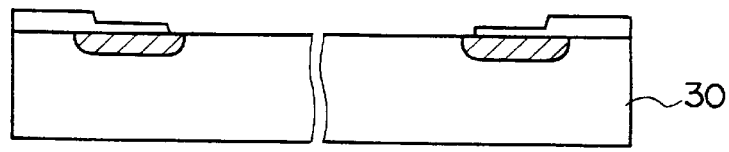
Figure 9E:
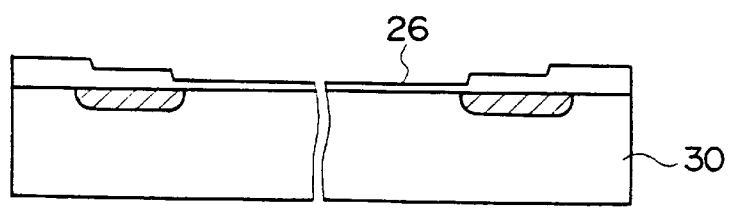

(4) Gate area removal:

A gate area open portion is produced by removing the oxidized film from the area for forming the spiral shaped gate electrode 10 (FIG. 9D). In the case of this embodiment, the gate open portion is also formed in a spiral shape in correspondence with the spiral shaped gate electrode 10. In this manner, only the portion of the p-Si substrate 30 corresponding to the spiral shaped gate electrode 10 is exposed.

(5) Gate oxidation film formation:

A new oxidation film, i.e., the insulation layer 26, is formed on the partially exposed p-Si substrate 30.

Figure 9F:
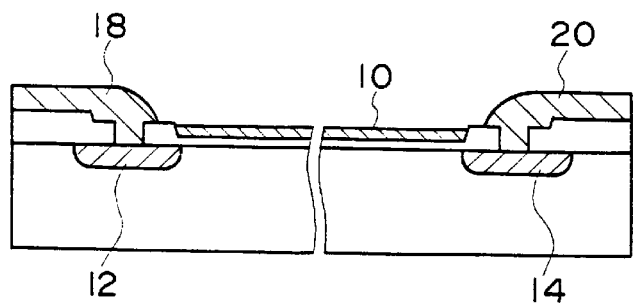

(6) Gate and electrode formation:

The spiral shaped gate electrode 10 functioning as a gate is formed, for example, by vapor deposition of aluminum or other material, as well as the input/output electrode 18 connected to the source 12 and the input/output electrode 20 connected to the drain 14 (FIG. 9F).

Figure 9G:
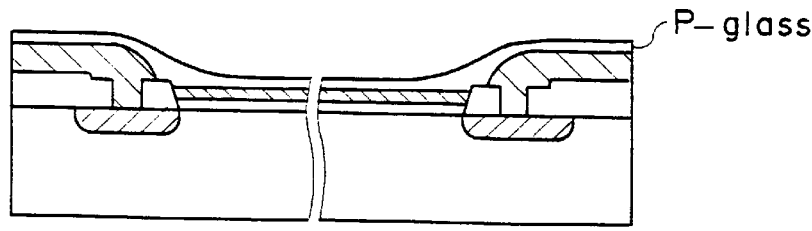

(7) Insulation layer formation:

Finally, P-glass is applied to the overall surface, after which heating provides a smooth surface (FIG. 9G).

In this manner, the LC element manufacturing process basically resembles the ordinary MOSFET manufacturing process and can be said to differ only in the shape and other qualities of the gate electrode 10. Consequently, formation is enabled on the same substrate with an ordinary MOSFET or bipolar transistor and formation is possible as a portion of an IC or LSI device. Moreover, when formed as a portion of an IC or LSI device, assembly operations in subsequent processing can be omitted.

In the case of the LC element according to this embodiment, the spiral shaped gate electrode 10 and channel 22 formed in correspondence thereof respectively comprise inductors, and at the same time, a distributed constant type capacitor is formed between the spiral shaped gate electrode 10 and channel 22.

Consequently, in a case where the ground electrode 16 provided at one end of the spiral shaped gate electrode 10 is grounded or connected to a fixed potential and the channel 22 is used as the signal transmission line, the resulting LC element possesses excellent attenuation characteristics with respect to the input signal over a wide band.

Also, as mentioned above, since this LC element can be manufactured by utilizing ordinary MOSFET type manufacturing technology, production is both easy and applicable to compactness and other requirements. In addition, when the LC element is manufactured as a portion of a semiconductor substrate, wiring to other components can be performed simultaneously, and assembly and other work during subsequent processing becomes unnecessary.

Also, in regard to the LC element 100 of this embodiment, the channel 22 resistance value can be variably controlled by changing the gate voltage (control voltage Vc) applied to the spiral shaped gate electrode 10, and the LC element 100 characteristics can be adjusted or changed within a certain range.

In the foregoing description of the first embodiment, the channel 22 formed in correspondence to the spiral shaped gate electrode 10 was used as the signal transmission line, but it is also acceptable to interchange the functions of the channel 22 and spiral shaped gate electrode 10. In other words, as indicated in FIG. 10, by connecting the input/output electrodes 18 and 20 to both ends of the spiral shaped gate electrode 10, and connecting the source 12 (or drain 14) formed at one end of the channel 22 to the ground electrode 16, and connecting this ground electrode 16 to the ground or a changeable fixed potential, the spiral shaped gate electrode 10 can be used as the signal transmission line.

In general, reducing the resistance of the inductor connected to the ground electrode 16 side is known to produce an LC element having sharp attenuation for specific frequency components. Consequently, compared to the LC element indicated in FIG. 1 (with the spiral shaped gate electrode 10 side grounded), the LC element indicated in FIG. 10 (with the channel 22 side grounded) has smaller Q, and possesses gentler attenuation for specific frequency components.

In the above case, since the ground electrode 16 is connected to either the source 12 or drain 14, the other electrode can be omitted.

Although the above description of the first embodiment referred to an enhancement type LC element whereby the channel 22 is formed by applying a voltage level relatively higher than the substrate 30 to the spiral shaped gate electrode 10, this can also refer to a depletion type LC element. In other words, by injecting carriers (n type impurities) beforehand into the channel 22 area indicated in FIGS. 1 and others, an n channel is formed. As a result, without raising the spiral shaped gate electrode 10 potential higher than the substrate 30, the channel 22 can be formed or the relationship between the applied gate voltage and channel width etc. can be changed. Also, it is acceptable to inject carriers only in a portion of the area along the spiral shaped gate electrode 10.

SECOND EMBODIMENT

An LC element in accordance with a second embodiment of the present invention differs from the first embodiment mainly by using non-spiral shapes for the gate electrode 10 and channel 22. In the figures, the same designations are used for items that correspond to those of the first embodiment.

Figure 11:
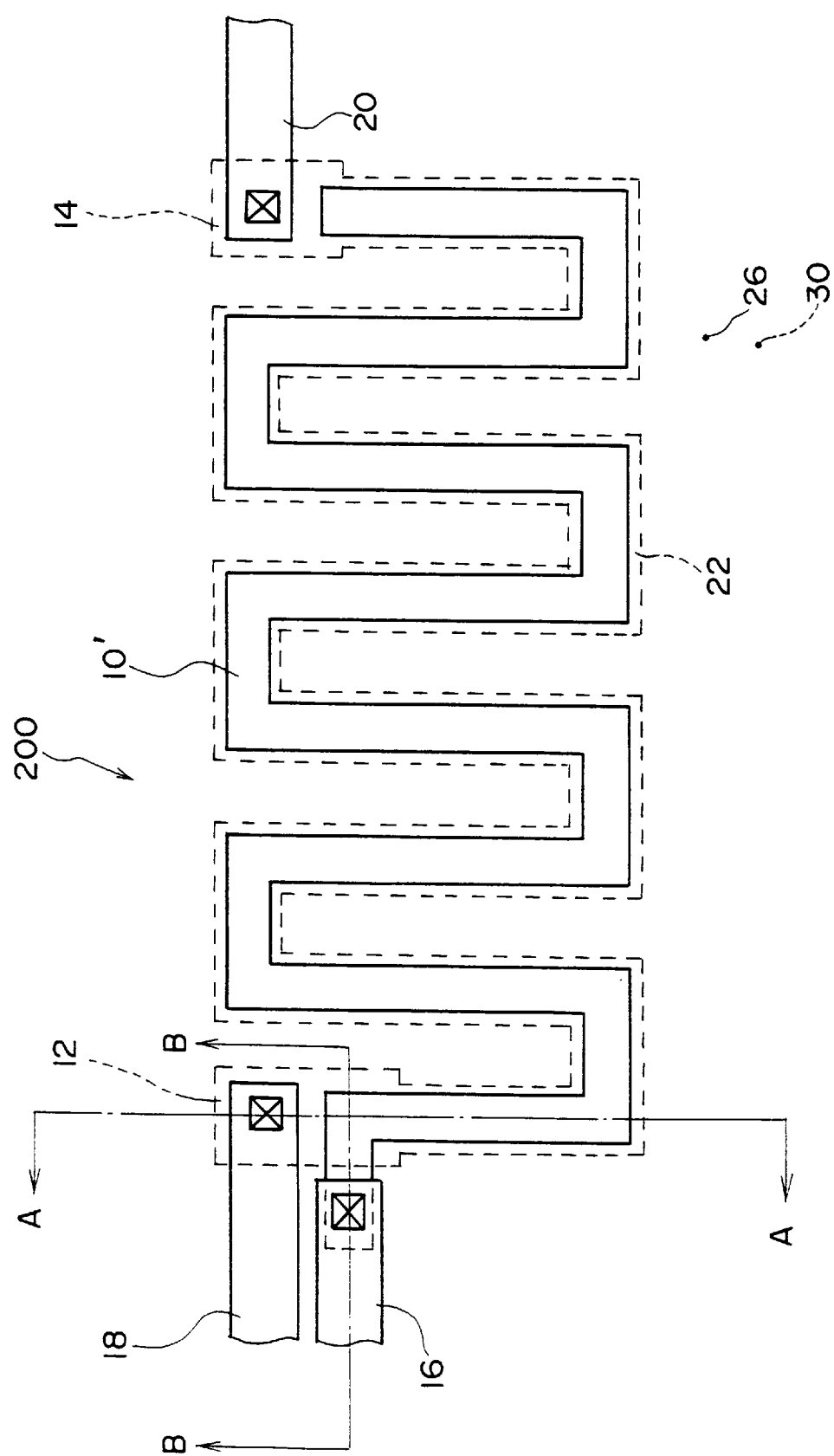
FIG. 11 is a plan view of an LC element in accordance with a second embodiment of this invention.
Figure 12:
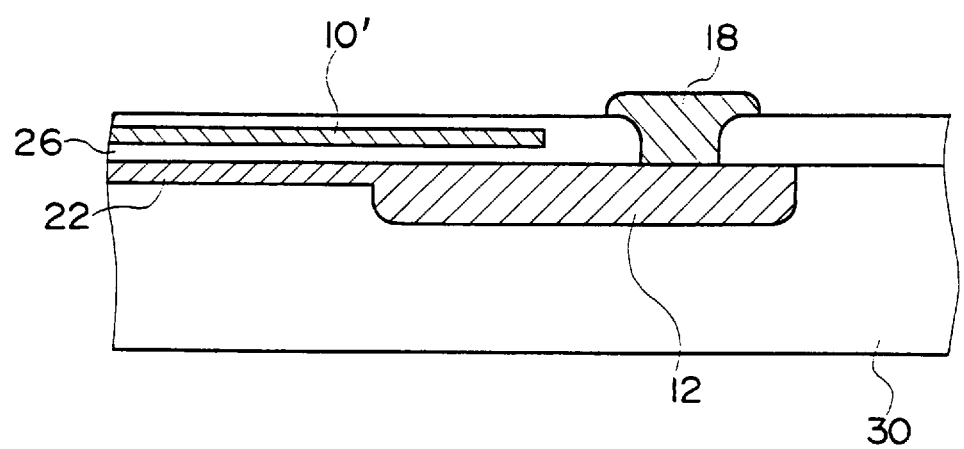
FIG. 12 is an enlarged cross-sectional view viewed along line A—A in FIG. 11.
Figure 13:
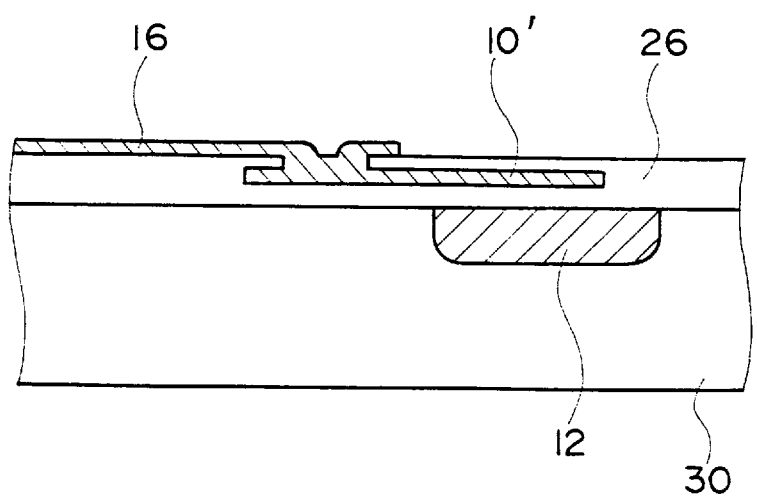
FIG. 13 is an enlarged cross-sectional view viewed along line B—B in FIG. 11.

FIG. 11 is a plan view of an LC element 200 in accordance with a second embodiment of this invention. FIG. 12 is an enlarged cross section along line A—A in FIG. 11, and FIG. 13 is an enlarged cross section along line B—B in FIG. 11.

Figure 14:
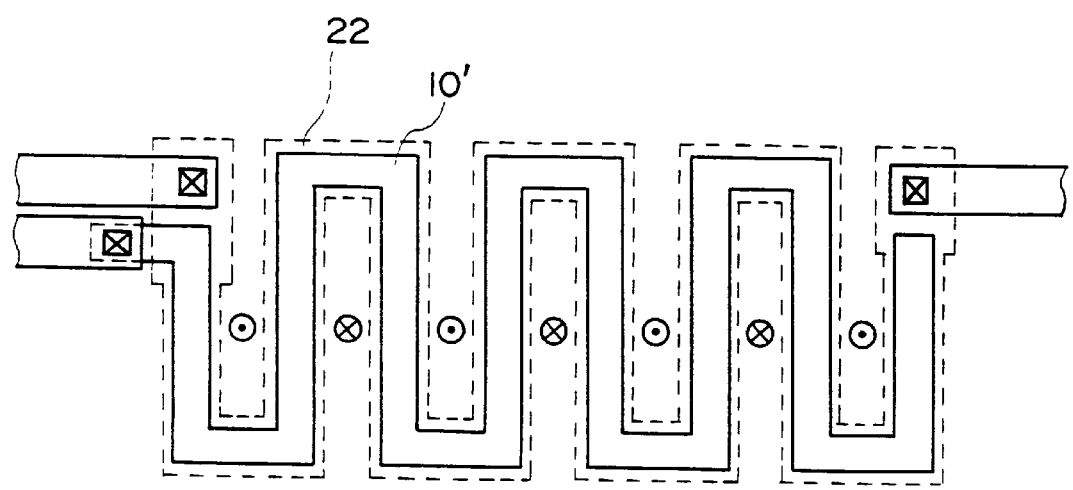
FIG. 14 indicates the principle of a meander shaped inductor.

FIG. 14 indicates the principle of a meander shaped inductor. In the case of a gate electrode 10' having a meander shape with concave and convex bends, when current flows in a single direction in the channel 22, magnetic flux is generated so as to reverse the direction in adjacent concave and convex portions, thereby resembling the state when ½ turn coils are connected in series. Consequently, the overall LC element 200 can be made to function as an inductor having a predetermined inductance in the same manner as the gate electrode or the channel of the first embodiment.

Also, in the case of a spiral shaped gate electrode, one of the gate electrode ends is positioned at the center portion, and the other end is positioned at the circumference portion. In contrast, in the case of a meander shaped gate electrode, since both ends of the gate electrode are positioned at the circumference portion, the arrangement is favorable for providing terminals and connecting to other circuit elements.

Figure 15:
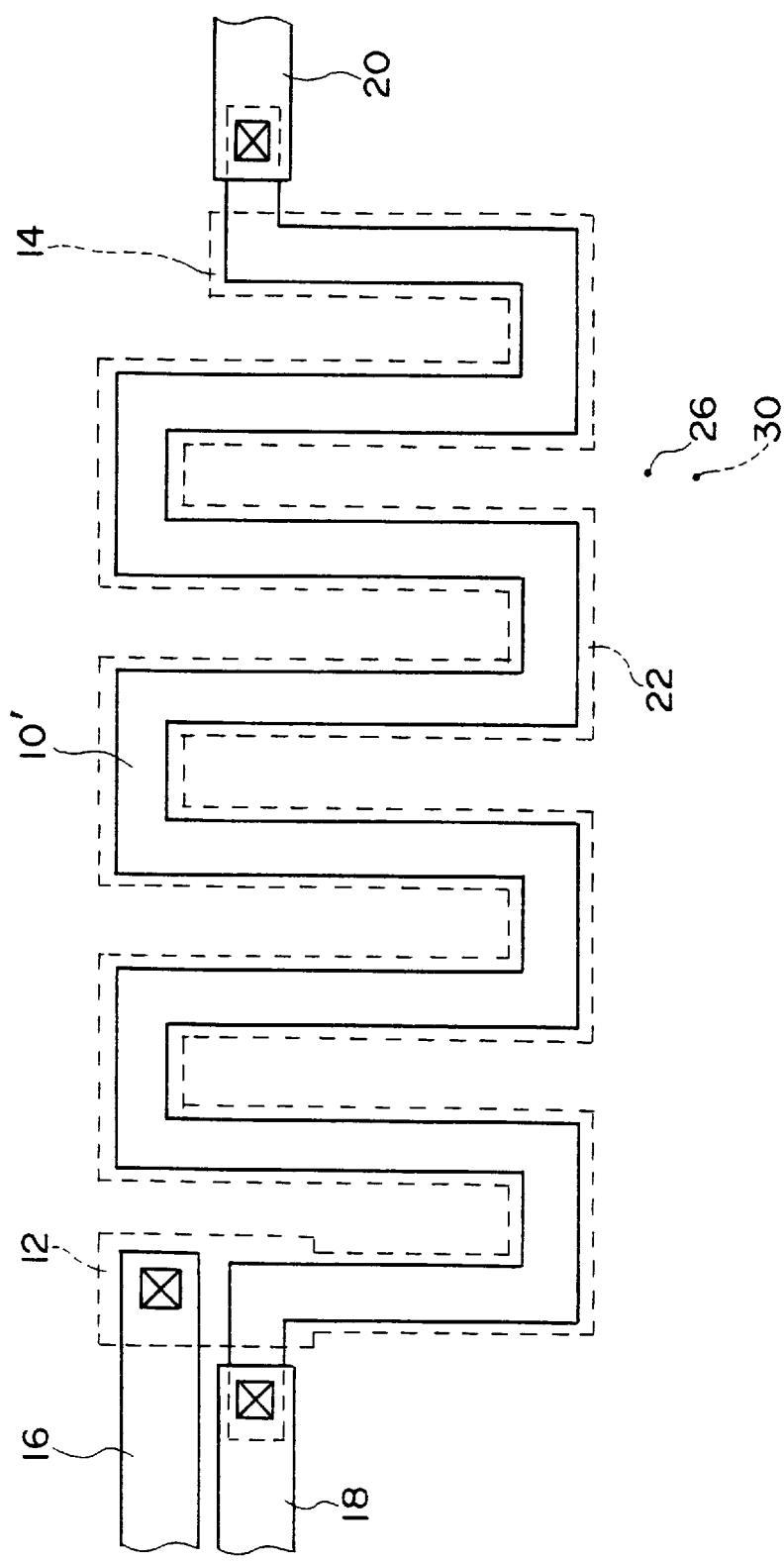
FIG. 15 indicates an example of a variation of an LC element in accordance with the second embodiment.

Also, in the case of the meander shaped gate electrode indicated in the FIG. 15 plan view wherein the ground electrode 16 is connected to the source 12 (or drain 14) formed at one end of the channel 22, the signal transmission line is not the channel 22, but the gate electrode 10'. The ground electrode is grounded or connected to a fixed potential.

In this manner, in the case of the LC element 200 of this embodiment, the non-spiral shaped gate electrode 10' and the channel 22 formed in correspondence thereof respectively comprise inductors and at the same time, a distributed constant type capacitor is formed between the non-spiral shaped gate electrode 10' and channel 22.

Consequently, in the case where the channel 22 is used as the signal transmission line, while connecting the ground electrode 16 provided at one end of the non-spiral shaped gate electrode 10' to the ground or a fixed potential, an LC element is comprised having excellent attenuation over a wide band with respect to the input signal.

Also, in the same manner as the first embodiment, since this LC element 200 can be manufactured by utilizing ordinary MOSFET type manufacturing technology, production is both easy and applicable to compactness and other requirements. Also, when the LC element is manufactured as a portion of a semiconductor substrate, wiring to other components can be performed simultaneously, and assembly and other work during subsequent processing become unnecessary.

In addition, in regard to the LC element 200 of this embodiment, the channel 22 resistance value can be variably controlled by changing the gate voltage (control voltage Vc) applied to the non-spiral shaped gate electrode 10', and the LC element 200 characteristics can be adjusted or changed within a certain range.

By utilizing a depletion type construction, whereby n type carriers are injected beforehand at the channel 22 position, even if the signal voltage level via the input/output electrodes 18 and 20 is positive, the channel 22 can be formed. This quality is also similar to the LC element of the first embodiment.

An additional feature is that since the gate electrode 10' and channel 22 are non-spiral shape, the signal input/output wiring can be performed on the same plane as the gate electrode 10' without crossing.

THIRD EMBODIMENT

Following is a description of an LC element in accordance with a third embodiment of this invention with reference to the attached drawings.

With respect to the LC element 100 of the first embodiment, wherein the spiral shaped gate electrode 10 and corresponding channel 22 are parallel over essentially their entire length, i.e., formed at nearly the same length, the LC element 300 of the third embodiment is characterized by shortening the spiral shaped gate electrode 10 to a predetermined length (for example, approximately 1 turn) and injecting carriers into the p-Si substrate 30 surface corresponding to this deleted portion.

Figure 16:
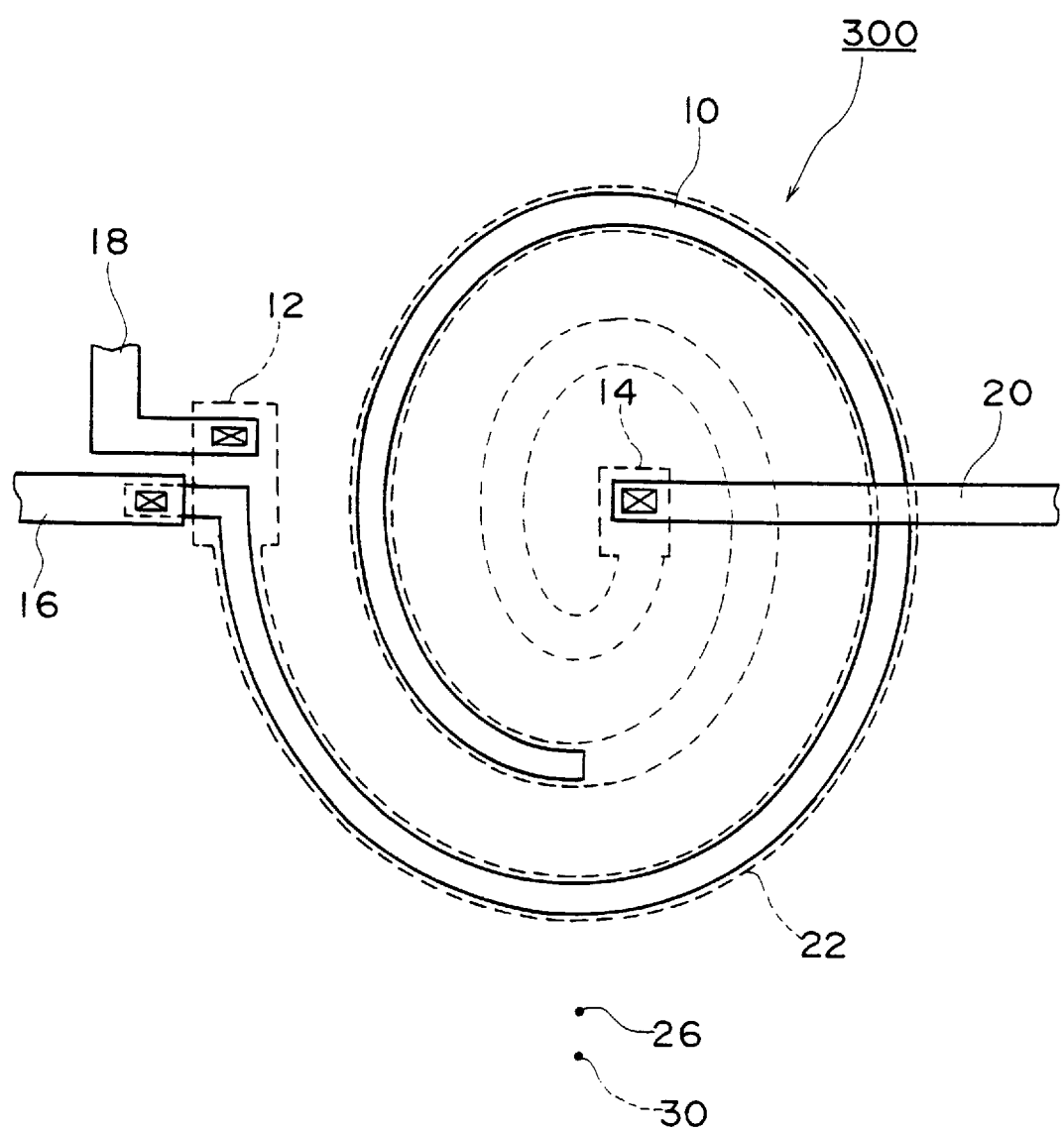
FIG. 16A is a plan view of an LC element in accordance with a third embodiment of this invention.
FIG. 16B is a plan view of an LC element in accordance with a third embodiment of this invention but having the channel shorter than the gate electrode.

FIG. 16 is a plan view of an LC element 300 according to the third embodiment. As indicated in the figure, the channel 22 is formed so as to connect between the source 12 and drain 14 formed near the surface of the p-Si substrate 30.

Approximately ½ the outer circumference side of this channel 22 corresponds to the spiral shaped gate electrode 10 functioning as a gate. The approximately ½ of this channel 22 at the inner circumference side is injected beforehand with n type carriers as impurities, and the spiral shaped channel 22 is formed even though the corresponding spiral shaped gate electrode 10 is absent.

In this manner, even when a portion of the spiral shaped gate electrode 10 is omitted and the spiral shaped gate electrode 10 length is shorter than the channel 22, without changing the functions of the spiral shaped gate electrode 10 as one inductor and the spiral shaped channel 22 as the other inductor, in the same manner as the LC element 100 indicated in FIG. 1, excellent attenuation characteristics are obtained. In particular, in the case of this LC element 300 of the third embodiment, since the spiral shaped gate electrode 10 can be set to a desired length, the capacitance of the formed distributed constant type capacitor can be freely set, and the design degree of freedom is also increased.

Figure 17:
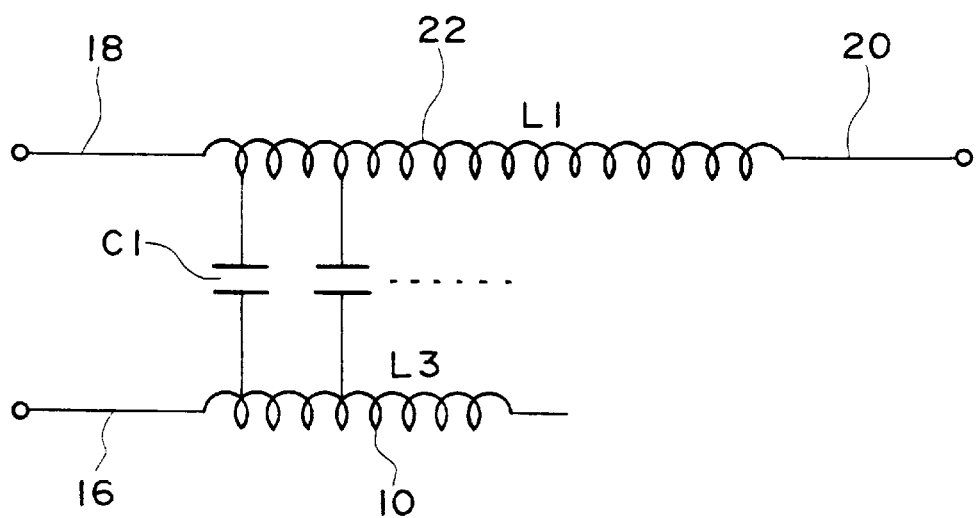
FIG. 17 is a schematic diagram indicating an equivalent circuit of an LC element in accordance with the third embodiment.

FIG. 17 indicates an equivalent circuit of the LC element 300 according to this embodiment. As indicated in the figure, the inductance L3 is reduced by only the extent of reduction in the spiral shaped gate electrode 10 turn quantity, and the corresponding distributed constant type capacitance Cl is also reduced. Consequently, the frequency response differs from the LC element 100 indicated in FIGS. 1 and others, and by adjusting the length (turn quantity) of this spiral shaped gate electrode 10, the frequency response can be adjusted or changed within a certain range.

Also, in the same manner as the foregoing embodiments, by changing the gate voltage applied to the ground electrode 16, the resistance of the channel 22 formed in correspondence to the spiral shaped gate electrode 10 can be varied, and the LC element attenuation characteristics can be variably controlled.

In addition, by depletion construction whereby n type carriers are injected beforehand at the position where the channel 22 is formed in correspondence to the spiral shaped gate electrode 10, even if the input/output voltage level at the input/output electrodes 18 and 20 is positive, the channel 22 can be formed at a position corresponding to the spiral shaped gate electrode 10, in the same manner as the foregoing embodiments.

In this manner, in the case of the LC element of this embodiment, a distributed constant type inductor and capacitor are formed by the spiral shaped gate electrode 10 and channel 22, and an element having excellent attenuation response functions can be composed.

Also, the same advantages of the first embodiment are possessed since the LC element 300 can be constructed by using semiconductor manufacturing technology and can be formed as a portion of an LSI or other device, while wiring work in subsequent processing can be omitted.

Although the foregoing description of the LC element 300 of the present embodiment referred to an example of using the channel 22 as the signal transmission line, it is also acceptable to interchange the functions of the spiral shaped gate electrode 10 and channel 22, connect the channel 22 side to ground or a fixed potential and use the spiral shaped gate electrode 10 as the signal transmission line. In this case, as shown in FIG. 16B, the channel 22 can be made shorter than the spiral shaped gate electrode 10 by injecting a large amount of p type impurities in the desired portion for cutting off the channel 22, or etching a portion of the p-Si substrate 30 to cut off the channel 22.

FOURTH EMBODIMENT

An LC element in accordance with a fourth embodiment of the present invention differs from the third embodiment by using non-spiral shapes for the gate electrode 10' and channel 22. In the figures, the same designations are used for items that correspond to those of the third embodiment.

Figure 18:
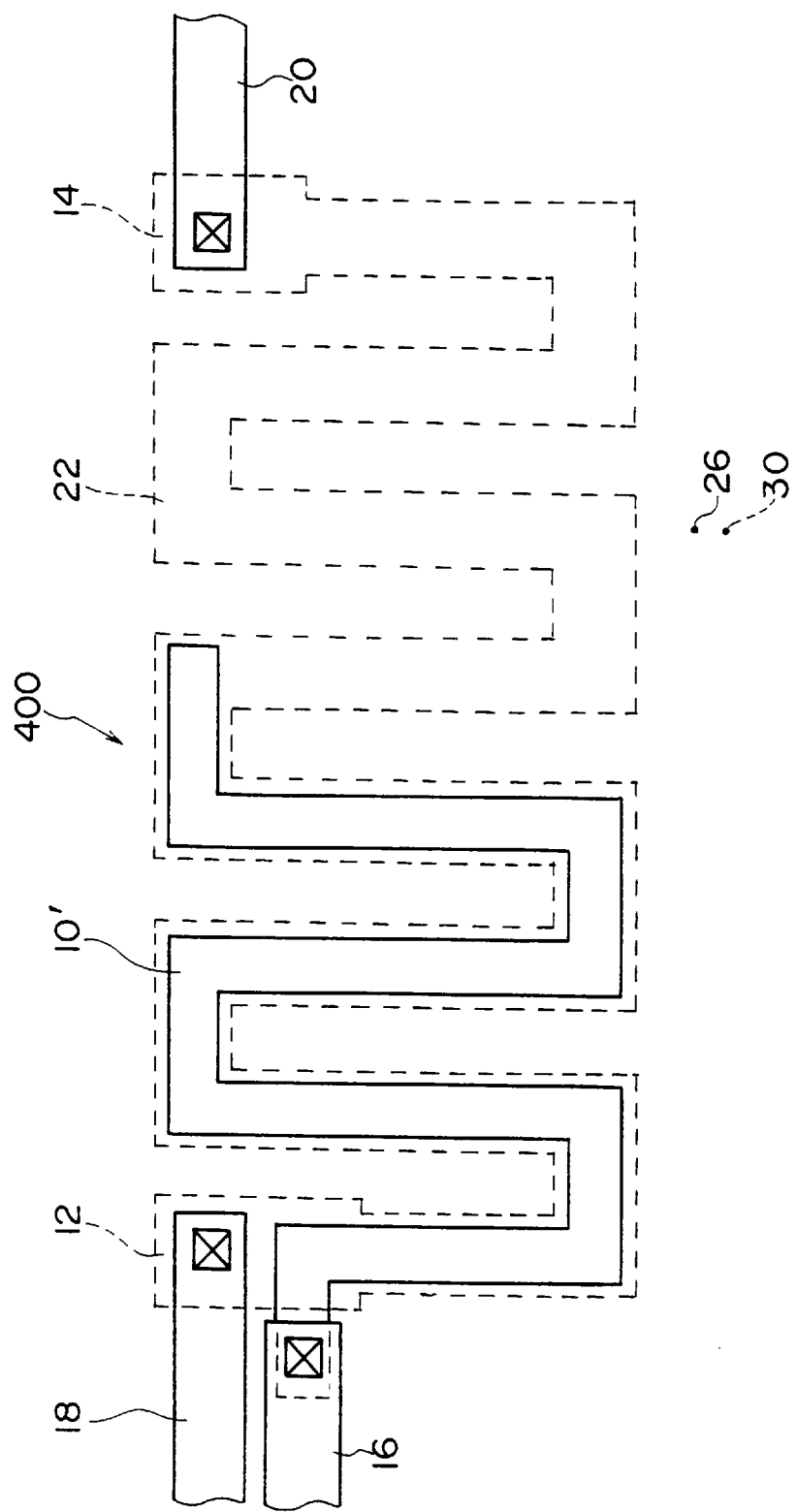
FIG. 18 is a plan view of an LC element in accordance with a fourth embodiment of this invention.

FIG. 18 is a plan view of an LC element 400 in accordance with a fourth embodiment of this invention. In the case of this embodiment, approximately one half the gate electrode 10' indicated in FIG. 1 is deleted, while carriers are injected into the p-Si substrate 30 surface corresponding to this deleted portion.

Except for the inductance and capacitance values, the equivalent circuit of this LC element 400 is the same as the third embodiment as indicated in FIG. 17. As indicated in the figure, by only the extent the gate electrode 10' numbers of concaves and convexes are smaller, the inductance L3 is reduced, and its corresponding distributed constant type capacitance C1 is also reduced.

In this manner, in the case of the LC element 400 of this embodiment, distributed constant type inductance and capacitance are formed by the non-spiral shaped gate electrode 10' and channel 22, and an element functioning with excellent attenuation characteristics is comprised.

By varying the gate voltage applied to the ground electrode 16, the resistance of the channel 22 formed in correspondence with the non-spiral shaped gate electrode 10' can be varied, enabling variable control of the LC element 400 attenuation characteristics.

Also, by utilizing a depletion type construction, whereby n type carriers are injected beforehand at the channel 22 position, even if the signal voltage level via the input/output electrodes 18 and 20 is positive, the channel 22 can be formed.

Also, the LC element 400 includes the same advantages as the above described embodiments in such terms as the LC element 400 can be constructed by using semiconductor manufacturing technology and can be formed as a portion of an LSI or other device, while wiring work in subsequent processing can be omitted.

Also, since the gate electrode 10' and channel 22 are non-spiral shape, the signal input/output wiring can be performed on the same plane as the gate electrode 10' without crossing.

FIFTH EMBODIMENT

Following is a description of an LC element in accordance with a fifth embodiment of this invention with reference to the attached drawings.

Although the LC elements 100, 200, 300 and 400 of the above described embodiments function as three-terminal normal mode type elements, the LC element 500 of this embodiment is formed so as to function as a four-terminal common mode type element.

Figure 19:
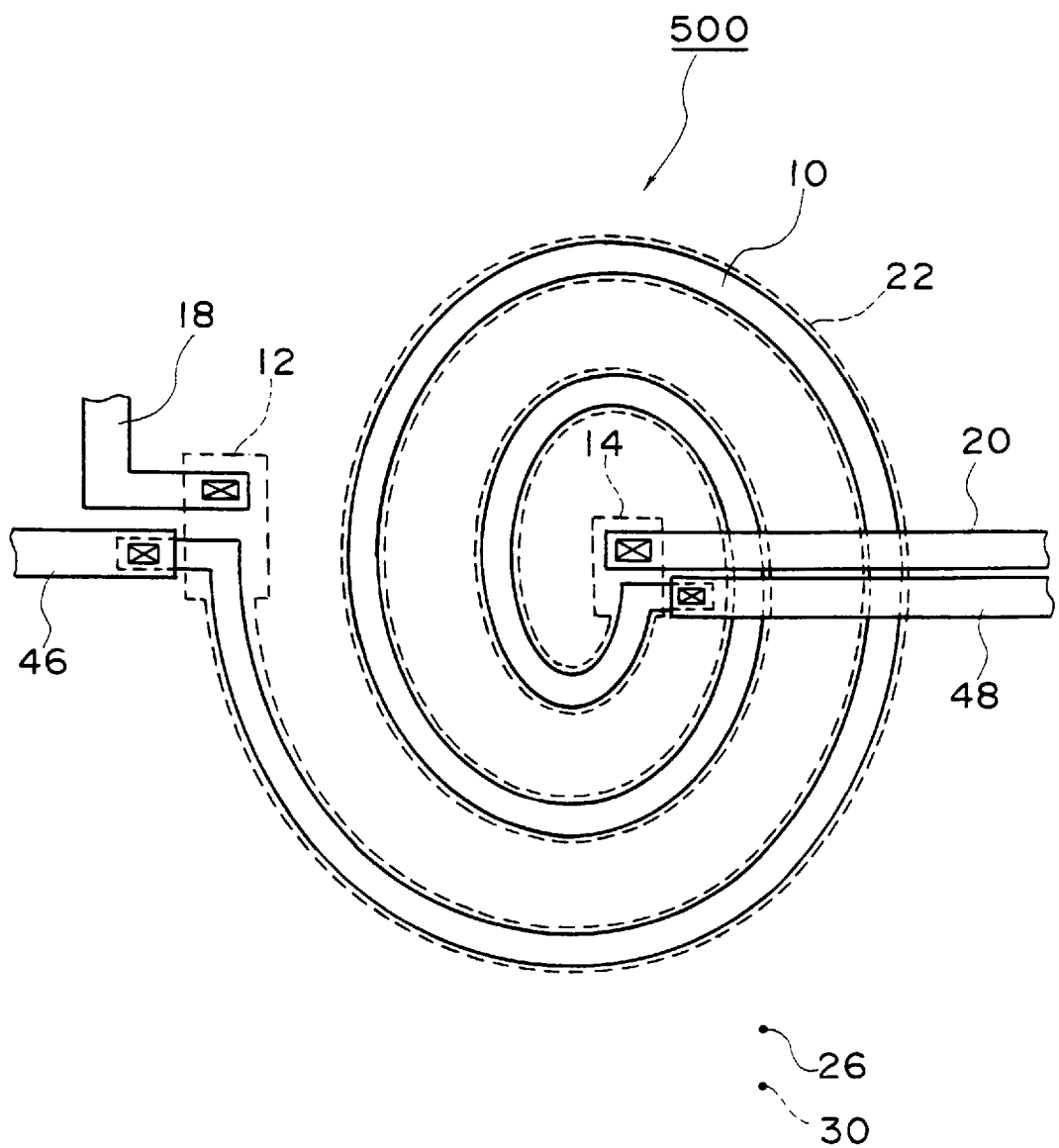
FIG. 19 is a plan view of an LC element in accordance with a fifth embodiment of this invention.

FIG. 19 is a plan view of an LC element 500 according to the fifth embodiment. As indicated in the figure, this LC element 500 comprises a channel 22, formed in correspondence to a spiral shaped gate electrode 10, connected between a source 12 and drain 14 formed at positions near the surface of a p-Si substrate 30. Also, input/output electrodes 46 and 48 are connected to each end respectively of this spiral shaped gate electrode 10. These points differ from the LC element 100 indicated in FIG. 1.

Figure 20:
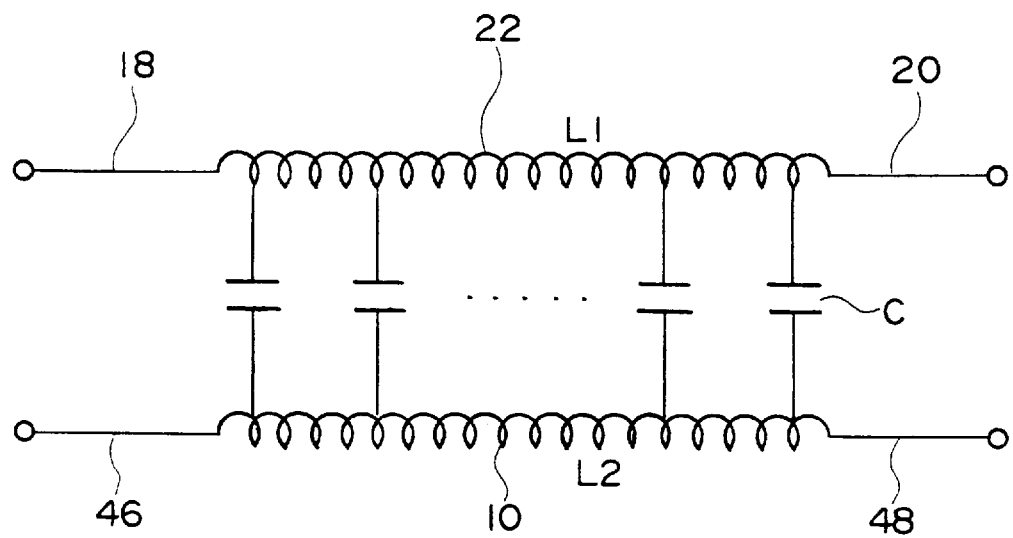
FIG. 20 is a schematic diagram indicating an equivalent circuit of an LC element in accordance with the fifth embodiment.

FIG. 20 indicates an equivalent circuit of the LC element 500. As indicated in the figure, the channel 22, formed between two input/output electrodes 18 and 20 formed via source 12 and drain 14, functions as an inductor having inductance L1, and at the same time, the spiral shaped gate electrode 10 formed between two input/output electrodes 46 and 48 functions as an inductor having inductance L2. Moreover, the channel 22 and spiral shaped gate electrode 10 are respectively used as signal transmission lines, and at the same time, a distributed constant type capacitor having capacitance C is formed between these in the same manner as the LC element 100 of the first embodiment.

Consequently, in the case of the LC element 500 of this embodiment, not only is channel 22 formed in correspondence to the spiral shaped gate electrode 10, but also by providing two input/output electrodes 46 and 48 at each end respectively of the spiral shaped gate electrode 10, the functions of a four-terminal common mode type element having excellent attenuation characteristics are enabled.

In the same manner as the above described LC elements 100 and 300, by changing the gate voltage applied to the spiral shaped gate electrode 10, the resistance of the channel 22 formed in correspondence with the spiral shaped gate electrode 10 can be changed, and the LC element 500 attenuation characteristics can be variably controlled in a certain range.

Also, by utilizing a depletion type construction, whereby n type carriers are injected beforehand at the channel 22 position, even if the signal voltage level via the input/output electrodes 18 and 20 is positive, the channel 22 can be formed.

Also, with the exception of the above mentioned construction differences (i.e., differences in characteristics resulting from these construction differences), the LC element 500 of this embodiment has the same cross-sectional construction etc. as the LC elements of the above mentioned LC elements. The LC element 500 includes the same advantages as the above described embodiments in such terms as the LC element 500 can be constructed by using MOS manufacturing technology and can be formed as a portion of an LSI or other device, while wiring work in subsequent processing can be omitted.

SIXTH EMBODIMENT

An LC element 600 in accordance with a sixth embodiment of this invention is basically the same as the LC element of the fifth embodiment, with the main difference being non-spiral shapes of the gate electrode 10' and channel 22. In the attached drawings, the same designations are used for items corresponding to the fifth embodiment.

Figure 21:
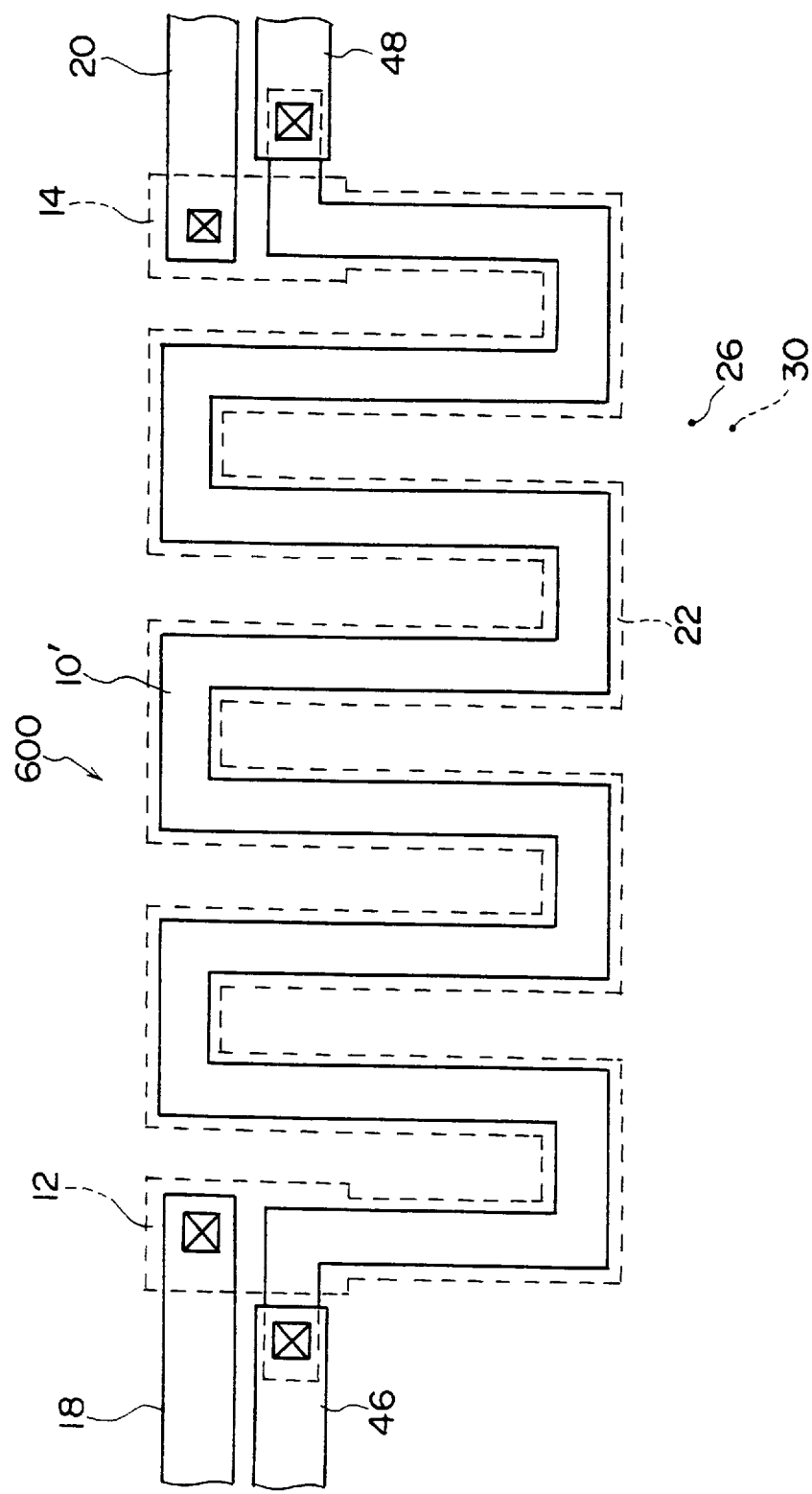
FIG. 21 is a plan view of an LC element in accordance with a sixth embodiment of this invention.

FIG. 21 is a plan view of an LC element 600 according to the sixth embodiment. As indicated in the figure, this LC element 600 comprises a channel 22, formed in correspondence to a gate electrode 10', connected between a source 12 and drain 14 formed at positions near the surface of a p-Si substrate 30. Also, input/output electrodes 46 and 48 are connected each end respectively of this gate electrode 10'. These points differ from the LC element 200 indicated in FIG. 11.

Except for the inductance and capacitance values, the equivalent circuit of this LC element 600 is the same as the fifth embodiment as indicated in FIG. 20. In the case of the LC element 600 of this embodiment, not only is channel 22 formed in correspondence to the non-spiral shaped gate electrode 10', but also by providing two input/output electrodes 46 and 48 at each end respectively of the non-spiral shaped gate electrode 10', the functions of a four-terminal common mode type element having excellent attenuation characteristics are enabled.

In the same manner as the above described LC elements, by changing the gate voltage applied to the non-spiral shaped gate electrode 10', the resistance of the channel 22 formed in correspondence with the non-spiral shaped gate electrode 10' can be changed, and the LC element 600 attenuation characteristics can be variably controlled within a certain range.

Also, by utilizing a depletion type construction, whereby n type carriers are injected beforehand at the channel 22 position, even if the signal voltage level via the input/output electrodes 18 and 20 is positive, the channel 22 can be formed.

Also, with the exception of the above mentioned construction differences (i .e. , differences in characteristics resulting from these construction differences), the LC element 600 of this embodiment has the same cross-sectional construction etc. as the LC elements of the above mentioned embodiments. This LC element 600 can be constructed by using MOS manufacturing technology and can be formed as a portion of an LSI or other device, while wiring work in subsequent processing can be omitted. These and other points are the same as the LC elements of the above described embodiments.

Also, since gate electrode 10' and channel 22 are non-spiral shape, the signal input/output wiring can be performed on the same plane as the gate electrode 10' without crossing.

SEVENTH EMBODIMENT

Following is a description of an LC element in accordance with a seventh embodiment of this invention with reference to the attached drawings.

With respect to the LC elements of the above described embodiments, wherein a single spiral shaped gate electrode 10 was formed, in the case of an LC element 700 in accordance with the seventh embodiment, the spiral shaped gate electrode 10 10 is divided into a plurality (for example, 2) of segments.

Figure 22:
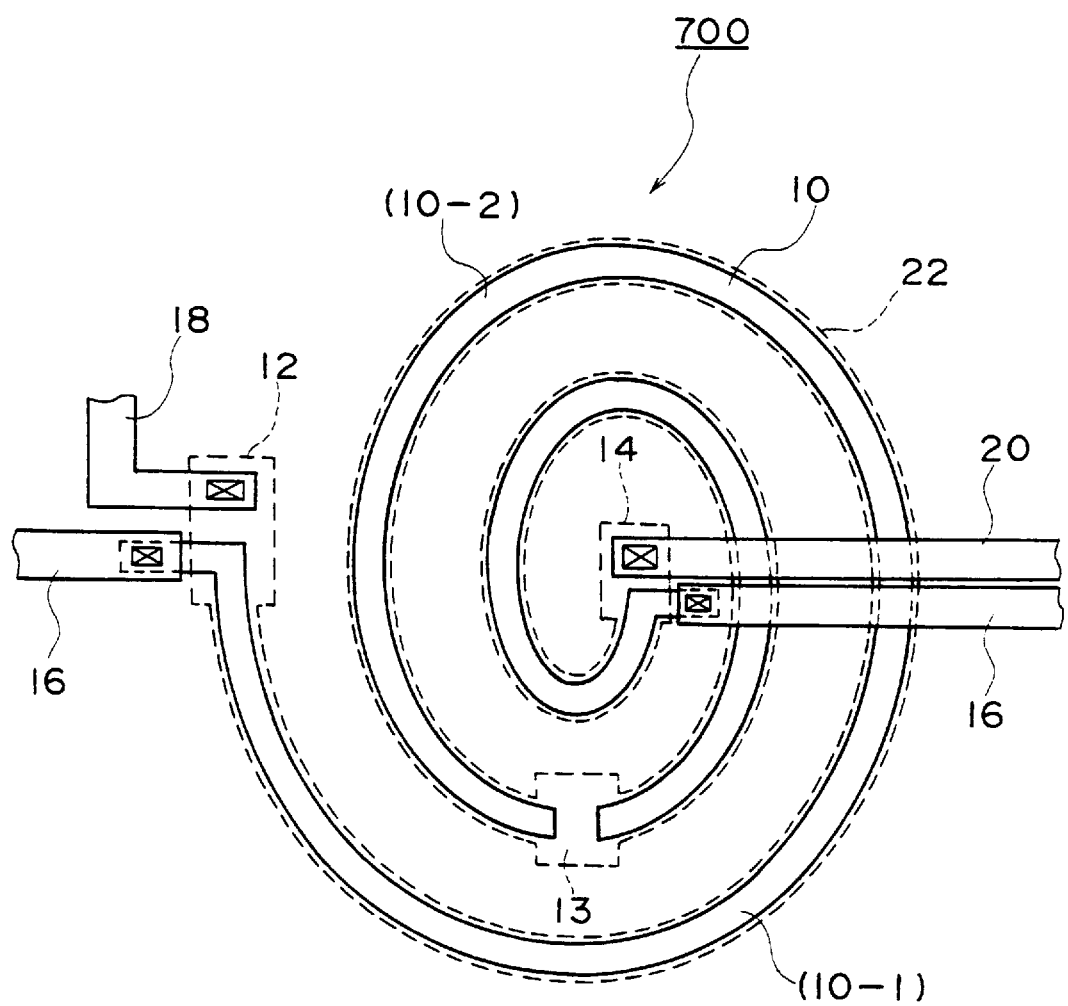
FIG. 22 is a plan view of an LC element in accordance with a seventh embodiment of this invention.

FIG. 22 is a plan view of an LC element 700 according to the seventh embodiment. As indicated in the figure, this LC element 700 is constructed with spiral shaped gate electrode 10, used in the LC element 100 indicated in FIG. 1, replaced by gate electrode segments 10-1 and 10-2. Ground electrodes 16 are connected respectively to one end of these divided overall spiral shaped gate electrode segments 10-1 and 10-2 (outer circumference end of outer side spiral shaped gate electrode segment 10-1 and inner circumference end of inner side spiral shaped gate electrode segment 10-2). By grounding each ground electrode 16, the inductors formed respectively by the gate electrode segments 10-1 and 10-2 are grounded. Alternatively, by connecting these ground electrodes 16 to a fixed potential power supply, the inductors formed respectively by the gate electrode segments 10-1 and 10-2 are set to this fixed potential.

Since the spiral shaped gate electrode 10 is divided, a space is produced between the divided gate electrode segments and there is risk of cutting the channel 22. Therefore, in the case of this embodiment, a diffusion region 13 is provided by injecting n type impurities into the p-Si substrate 30 surface corresponding to the space portions between the divided gate electrode segments. The plurality of channels 22 formed respectively in correspondence to the divided gate electrode segments 10-1 and 10-2 then function as a single conductor via this diffusion region 13.

Figure 23:
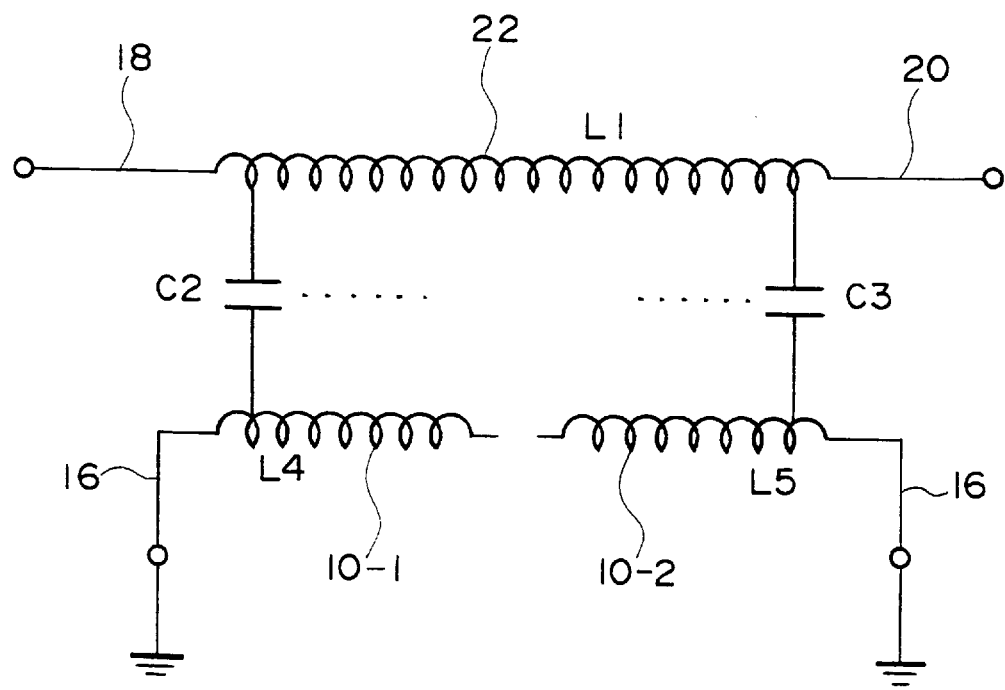
FIG. 23 is a schematic diagram indicating an equivalent circuit of an LC element in accordance with the seventh embodiment.

FIG. 23 indicates an equivalent circuit of an LC element 700 in accordance with the seventh embodiment. As indicated in the figure, the channel 22 formed in correspondence to the respective divided gate electrode segments 10-1 and 10-2 functions as an inductor having inductance L1, and at the same time, the divided gate electrode segments 10-1 and 10-2 function as inductors having inductances L4 and L5. Also, the channel 22 and divided gate electrode segment 10-1, and channel 22 and divided gate electrode segment 10-2 function as capacitors having respective capacitances C2 and C3. In addition, these capacitors are formed as distributed constant types.

In the LC element 700 of this embodiment, the self-inductance L4 and L5 of the divided gate electrode segments 10-1 and 10-2 gets smaller. Consequently, the effect of these self-inductances on the overall characteristics of the LC element 700 is small, and the inductance L1 of the channel 22 and distributed constant type capacitances C2 and C3 determine most of the overall LC element 700 characteristics. Consequently, by changing the division state of the spiral shaped gate electrode 10, LC elements can be formed having differing characteristics from the LC elements indicated in the first and other embodiments, thereby increasing the design degree of freedom.

Also, by utilizing a depletion type construction, whereby n type carriers are injected beforehand at the channel 22 position, even if the signal voltage level via the input/output electrodes 18 and 20 is positive, the channel 22 can be formed.

In addition, advantages in common with the LC elements of the above described embodiments include the points that the LC element 700 can be constructed by using semiconductor manufacturing technology and can be formed as a portion of an LSI or other device, wiring work in subsequent processing can be omitted. Also, by changing the voltage applied to the spiral shaped gate electrode 10, the overall attenuation characteristics of the LC element can be changed.

The case of the plan construction LC element 700 of this embodiment indicated in FIG. 22, although the channel 22 was used as the signal transmission line, and the spiral shaped gate electrode 10 was divided into a plurality of segments, conversely dividing the channel 22 into a plurality of segments is also acceptable. In this case, since the channel 22 needs to be electrically divided into a plurality of segments in the state with voltage applied to the spiral shaped gate electrode 10, it is necessary to divide the channel 22 into a plurality of segments by injecting p type impurities beforehand, or by such techniques as etching a portion of the p-Si substrate 30 at a portion where this channel 22 is to be formed.

EIGHTH EMBODIMENT

An LC element in accordance with an eighth embodiment of the present invention differs from the first embodiment mainly by using non-spiral shapes for the gate electrode 10 and channel 22. In the figures, the same designations are used for items that correspond to those of the first embodiment.

FIG. 24 is a plan view of an LC element 800 according to the eighth embodiment. As indicated in the figure, the LC element is constructed with the meander shaped gate electrode 10' used in the LC element 200 indicated in FIG. 11 replaced by gate electrode segments 10'-1 and 10'-2.

Figure 28:
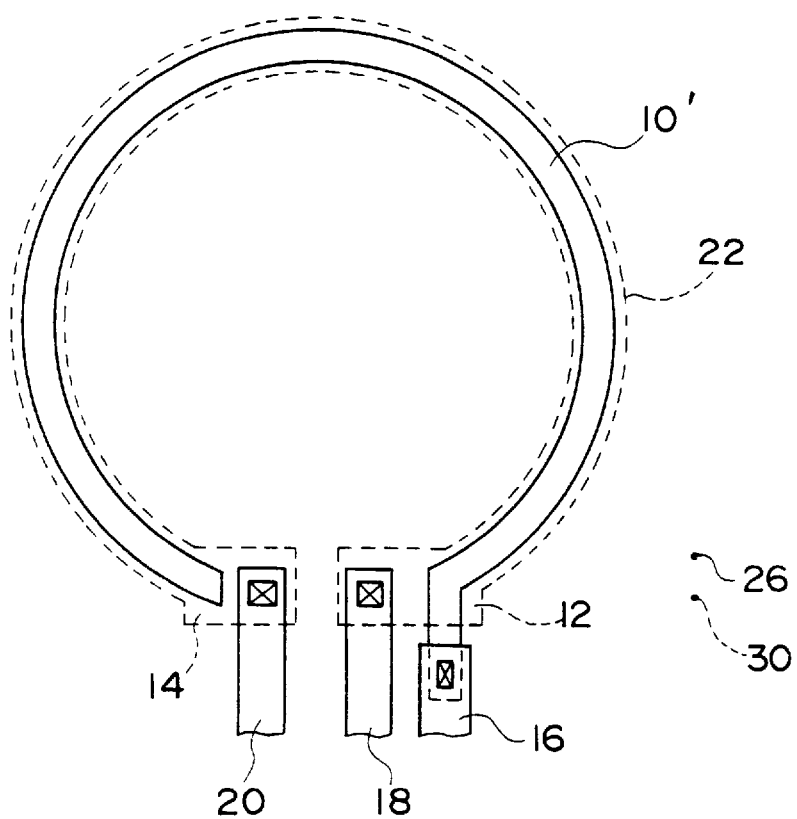
FIG. 28 is a plan view of an LC element having a partial circle shaped electrode.

Except for the inductance and capacitance values, the equivalent circuit of the LC element 800 is the same as the seventh embodiment, i.e., FIG. 28. In the case of the LC element 800 of the eighth embodiment, the self-inductance L4 and L5 of the respective divided gate electrode segments 10'-1 and 10'-2 gets smaller. Consequently, the effect of these self-inductances on the overall characteristics of the LC element 800 is small, and the inductance L1 of the channel 22 and distributed constant type capacitances C2 and C3 determine most of the overall LC element 800 characteristics. Therefore, by changing the division state of the non-spiral shaped gate electrode 10', LC elements can be formed having differing characteristics from the LC elements indicated in the first and other embodiments, thereby increasing the design degree of freedom.

Also, by utilizing a depletion type construction, whereby n type carriers are injected beforehand at the channel 22 position, even if the signal voltage level via the input/output electrodes 18 and 20 is positive, the channel 22 can be formed.

In addition, advantages in common with the LC elements of the above described embodiments include the points that the LC element 800 can be constructed by using semiconductor manufacturing technology and can be formed as a portion of an LSI or other device, wiring work in subsequent processing can be omitted. Also, by changing the voltage applied to the spiral shaped gate electrode 10, the overall attenuation characteristics of the LC element can be changed.

Also, since gate electrode 10' and channel 22 are non-spiral shape, the signal input/output wiring can be performed on the same plane as the gate electrode 10' without crossing.

NINTH EMBODIMENT

Following is a description of an LC element in accordance with a ninth embodiment of this invention with reference to the attached figures.

In general, an inductor function having a predetermined inductance is obtained by using a spiral shape for a conductor. Also, as mentioned above, an inductor function having a predetermined inductance is obtained in cases where a meander shape is used for the gate electrode 10' and channel 22. However, in cases where the input signal frequency band is limited to high frequency, shapes other than spiral and meander, and in extreme cases, a straight line shape, can function as inductors having an inductance components. The LC element of this embodiment considers these points and relates to forming the gate electrode in other than spiral or meander shape.

FIGS. 25A, 25B, 26A and 26B are plan views of LC elements wherein the gate electrode 10' and channel 22 respectively have straight line shapes.

FIG. 25A corresponds to the above mentioned FIGS. 1 and 11, and indicates a three-terminal type LC element wherein channel 22 is formed over the entire length of the gate electrode 10' functioning as a gate. The LC element indicated in the figure may be either an enhancement type or depletion type.

FIG. 25B corresponds to FIGS. 16A and 18. The gate electrode 10' is disposed so as to oppose a portion of the channel 22 and carriers are injected beforehand in the portion of the channel 22 not opposing the gate electrode 10'. A depletion type is also acceptable, in which carriers are injected beforehand over the entire length of the channel 22.

FIG. 26A corresponds to FIGS. 19 and 21, and indicates a common mode type case, in which input/output electrodes 46 and 48 are formed at both ends of straight line shaped gate electrode 10'. FIG. 26B corresponds to FIGS. 22 and 24, and indicates a case where a plurality of divided gate electrode segments 10'-1 and 10'-2 are provided.

FIGS. 27A and 27B are plan views of respective LC elements using arc shapes and sinusoidal shapes for the gate electrode 10' and channel 22. FIG. 27A indicates a case of an arc with a large radius of curvature. The gate electrode 10' and channel 22 shapes such as indicated in FIG. 27A are suitable in cases where other components etc. must be arranged at positions that obstruct the straight line joining the source 12 and drain 14.

FIG. 27B indicates a case of a sinusoidal shape. Although not to the extent of the meander shape indicated in FIGS. 11 and others, this LC element possesses a larger inductance component compared to the cases of using straight line or large arc shapes for the gate electrode 10' and other structures.

Figure 29:
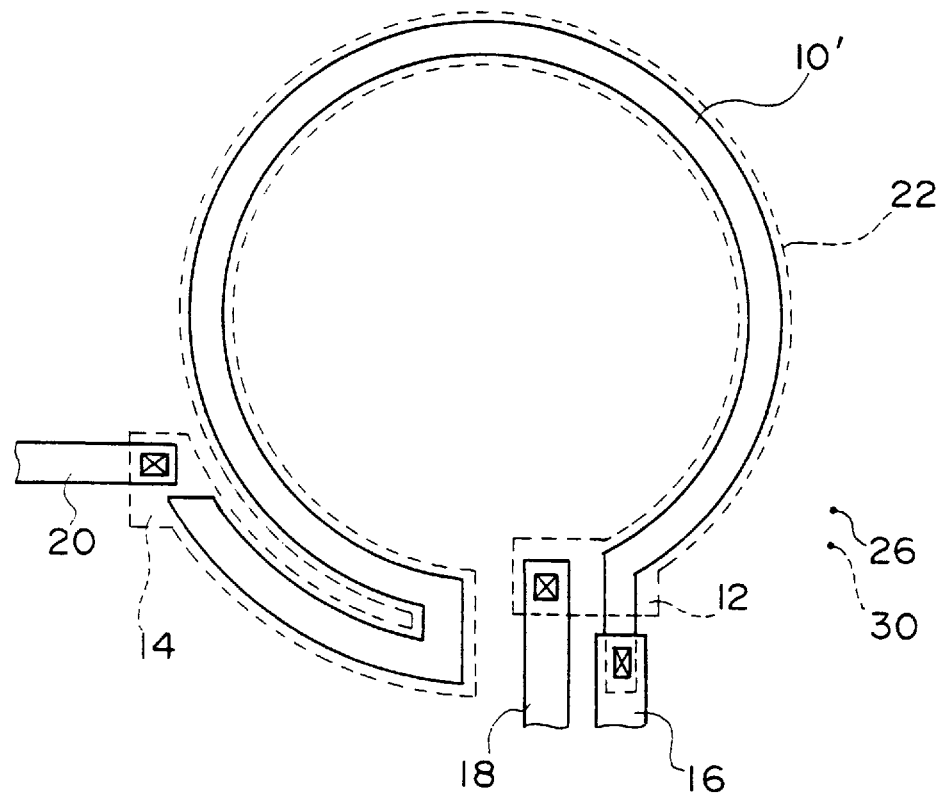
FIG. 29 is a plan view of an LC element having a partial circle shaped electrode with a back folded portion.

FIG. 28 is a plan view of an LC element having an incomplete circular shape for the gate electrode 10' and channel 22. FIG. 29 is a plan view of an LC element having an incomplete circular shape for the gate electrode 10' and channel 22 with a folded back portion at the end. As indicated in these figures, by forming the gate electrode 10' and channel 22 in a circular shape, an LC element can be formed having a small inductance. Also, as indicated in FIG. 29, by folding back a portion at one end (or both ends) of the gate electrode 10' and channel 22, the generated magnetic flux can be partially cancelled and inductance reduced, thereby allowing adjustment of the LC element overall inductance, i.e., frequency response.

In order to simplify the description, although the above mentioned FIGS. 25A–29 respectively correspond only to the LC element indicated in FIG. 25A, the same concepts can also be applied with respect to the types indicated in FIGS. 25B, 26A and 26B.

As described, the LC elements indicated in FIGS. 25A–29, relate to other than meander shapes for the gate electrode 10' etc. In the same manner as the above described embodiments 1–8, functions can be obtained as noise filters having excellent attenuation characteristics. In the same manner as the above described LC elements 100 and others of the foregoing embodiments, by changing the gate voltage applied to the gate electrode 10', the resistance of the channel 22 formed in correspondence with the gate electrode 10' can be changed, and the attenuation characteristics of the LC element as a whole can be variably controlled in a certain range.

In addition, the LC element can be constructed by using semiconductor manufacturing technology and can be formed as a portion of an LSI or other device, while wiring work in subsequent processing can be omitted. These and other points are the same as the LC elements of the above described embodiments and the same advantages as these embodiments are possessed.

In this manner, in cases where applications are limited to high frequency band signals, since a desired shape other than spiral shape can be used for the gate electrode 10' and channel 22 (or channel 22 only), an LC element can be formed so that it would efficiently utilizes available space on the semiconductor substrate.

OTHER EMBODIMENTS

Following is a description of LC elements related to other embodiments of this invention with reference to the attached figures.

In the LC elements of the above mentioned embodiments, although the source 12 and drain 14 were arranged at separated positions near both ends of the electrode 10, it is also acceptable to modify the electrode 10 shape and arrange the source 12 and drain 14 at nearby positions.

Figure 30:
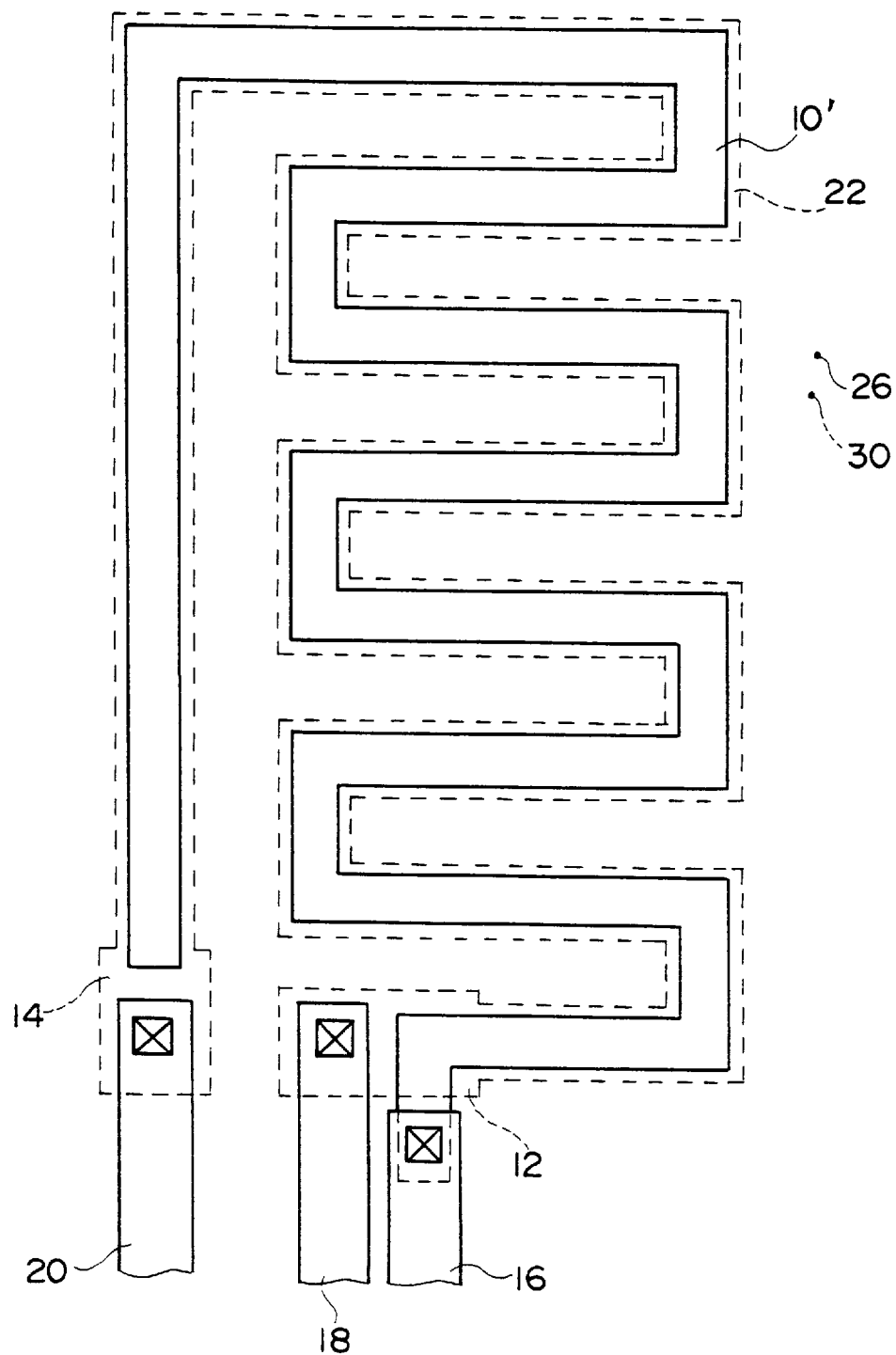
FIG. 30 indicates an example of a variation in the electrode shape.
Figure 31:
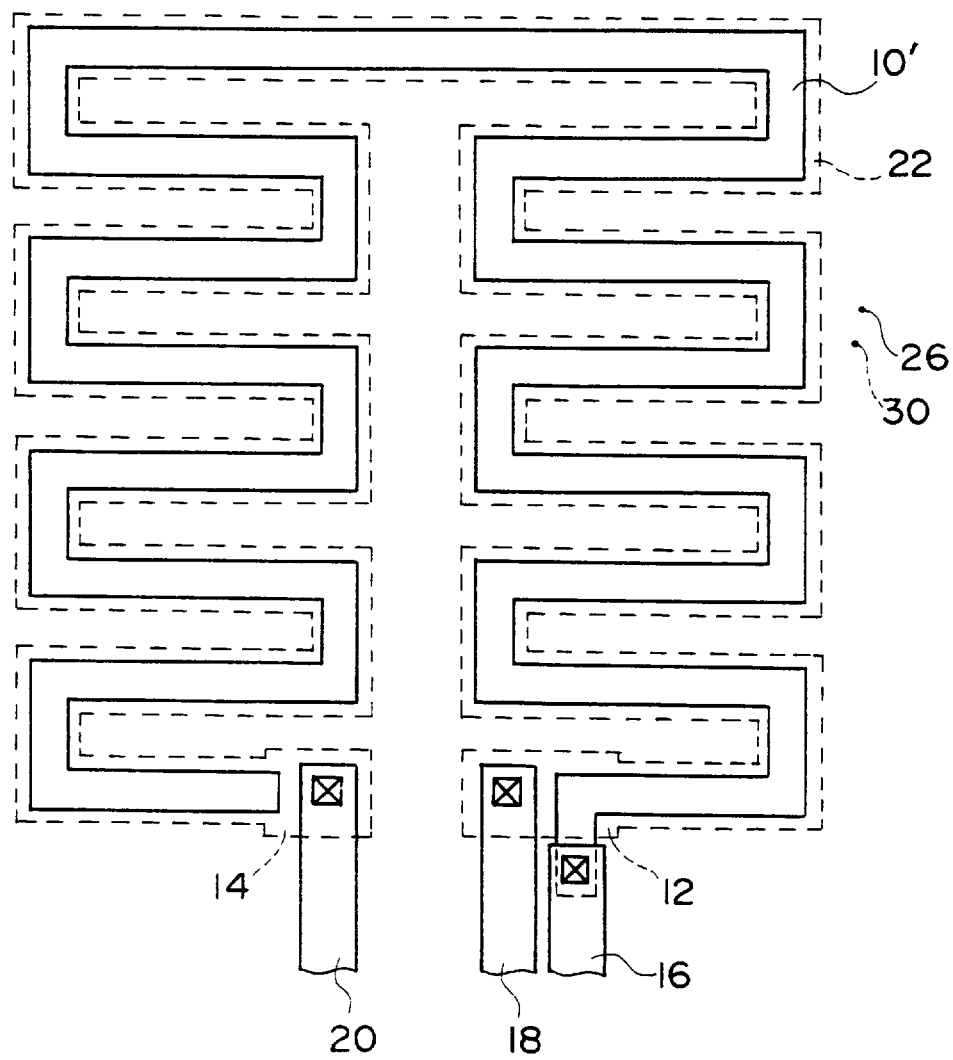
FIG. 31 indicates an example of another variation in the electrode shape.

For example, as indicated in FIG. 30, together with arranging the source 12 and drain 14 at adjacent positions of the LC element 100 etc., one end of the electrode 10 is extended to reach the drain 14. Also, as indicated in FIG. 31, together with arranging the source 12 and drain 14 at adjacent positions, the gate electrode 10 is folded back while maintaining the shape of the LC element 100 and the like.

In this manner, by modifying the electrode 10 shape, the source 12 and drain 14 positions are nearby, and the ground electrode 16, and input/output electrodes 18 and 20, can be formed at nearly the same position. Consequently, wiring when providing terminals can be performed easily and subsequent processes can be performed easier.

Figure 32:
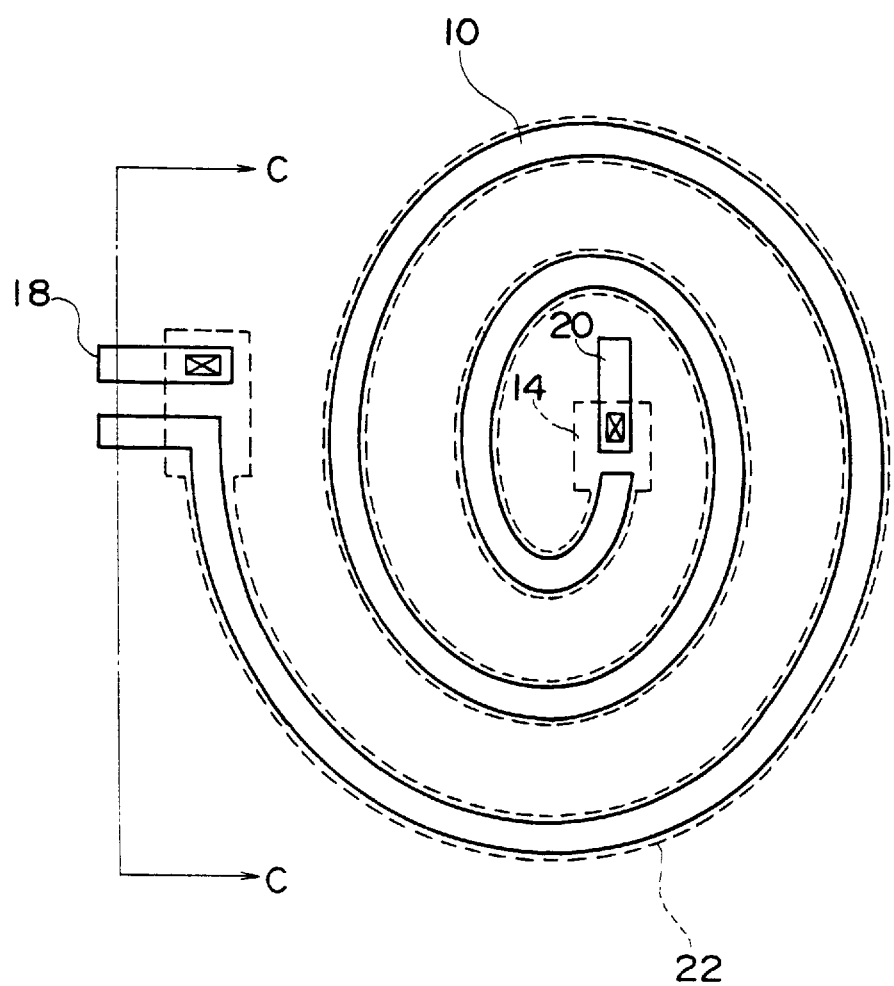
FIG. 32 is an abbreviated plan view of a case where terminals are provided using a chemical liquid phase method.
Figure 33:
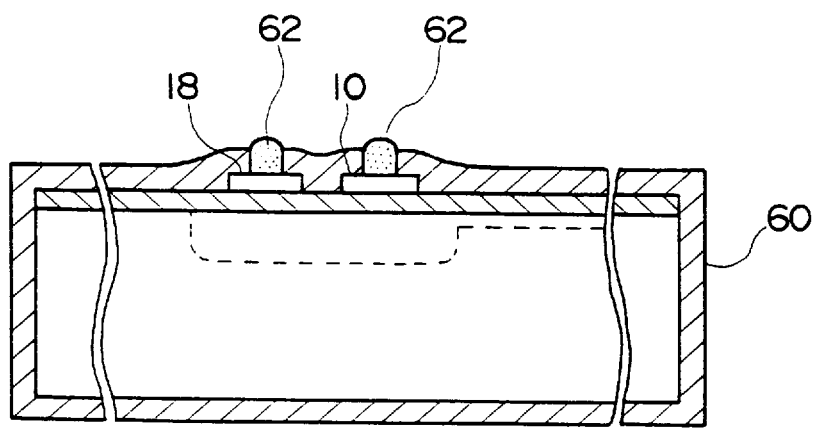
FIG. 33 is a cross-sectional view along line C—C in FIG. 32.

Also, FIGS. 32 and 33 are abbreviated drawings indicating a case of providing terminals by chemical liquid phase methods. FIG. 32 indicates a plan view of providing terminals for an LC element in accordance with these embodiments. For example, the case of providing terminals by a chemical liquid phase method for an LC element 100 of the first embodiment is indicated (also applicable to providing terminals for LC elements of the other embodiments). The LC element indicated in FIG. 32 differs from the LC element 100 of the first embodiment by shortened input/output electrodes 18 and 20, and omitting the ground electrode 16.

The LC element cross section indicated in FIG. 33 corresponds to a cross section viewed along line C—C in FIG. 32 of a semiconductor substrate prior to undergoing the following process.

In the case of an LC element having a cross section such as indicated in FIG. 33, after the semiconductor substrate is first cut off for each LC element, a silicon dioxide film 60 is formed as an insulation layer on all surfaces of each individual cut off chip (element) by chemical liquid phase processing. Then by etching, the silicon dioxide film 60 over the spiral shaped gate electrode 10 or input/output electrodes 18 and 20 is removed. These openings are closed with solder so as to raise them from the surface to where the protruding solder 62 can directly contact printed wiring board lands. Consequently, the resulting conditions are favorable to surface mounting. Particularly, by making the height of the input/output electrode 18 indicated in FIG. 33 (as well as input/output electrode 20) the same as the spiral shaped gate electrode 10, the protruding solder 62 can also be formed at nearly the same height to provide more favorable conditions for surface mounting.

Other materials such as synthetic resin can be used for the element surface protective film. Laser light can also be used for the protective film perforations. Also, the ground electrode 16 can be formed at one end of the spiral shaped gate electrode 10, then solder applied to this portion.

Figure 34:
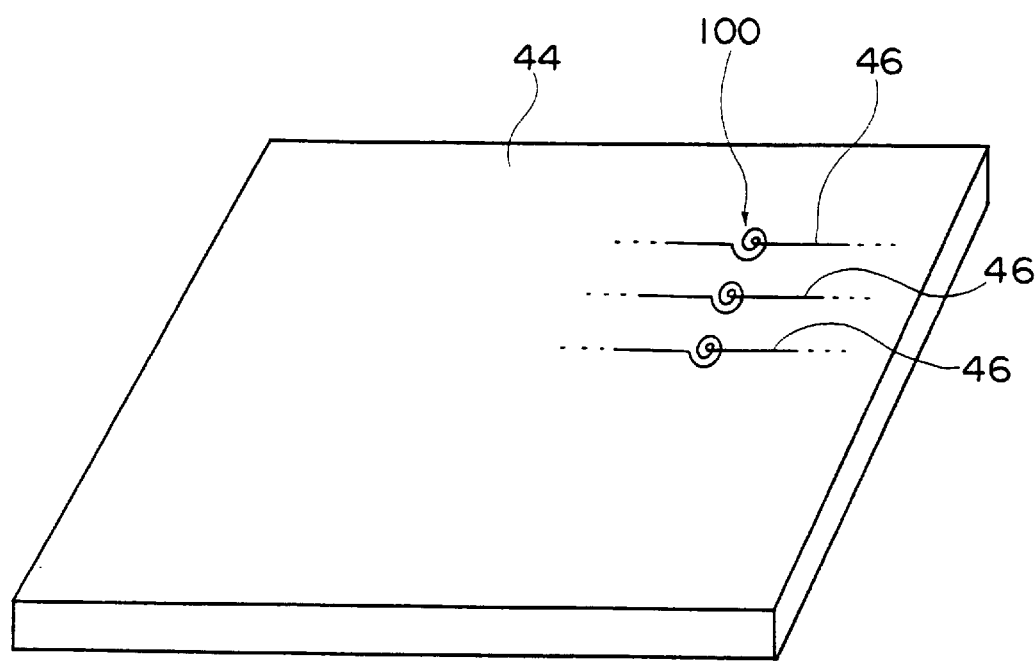
FIG. 34 is an explanatory drawing of forming LC elements of each embodiment as portions of an LSI or other device.

FIG. 34 is a descriptive drawing of a case where LC elements of the above mentioned embodiments are formed as portions of an LSI or other device. As indicated in the figure, on a semiconductor chip 44, the LC elements 100 etc. of the above mentioned embodiments are assembled by insertion into the signal and/or power supply lines 46. In particular, since the LC elements of the above embodiments can be produced simultaneously with the process for forming the various types of circuits on the semiconductor chip 44, there is the advantage that wiring and other treatment during subsequent processing is unnecessary.

In the following, examples using the LC elements as a part of actual electronic circuits are given. Even though those examples are given using the LC element 100, LC elements described in the second embodiment onwards can also be used similarly.

In general, regarding the LC elements of the above embodiments, the channel 22 forming an inductor has high resistance and signal voltage level attenuation is produced between the two input/output electrodes 18 and 20. For this reason, when using an LC element of these embodiments as a portion of a circuit, practical construction is obtained by connecting a high input impedance buffer to the output side. Also, by connecting a buffer to the output side of an LC element in accordance with this invention, the output impedance of the LC elements of the above embodiments can be matched to the next stage circuit input impedance. In addition, the output from the LC element can be current amplified.

Figure 35A:
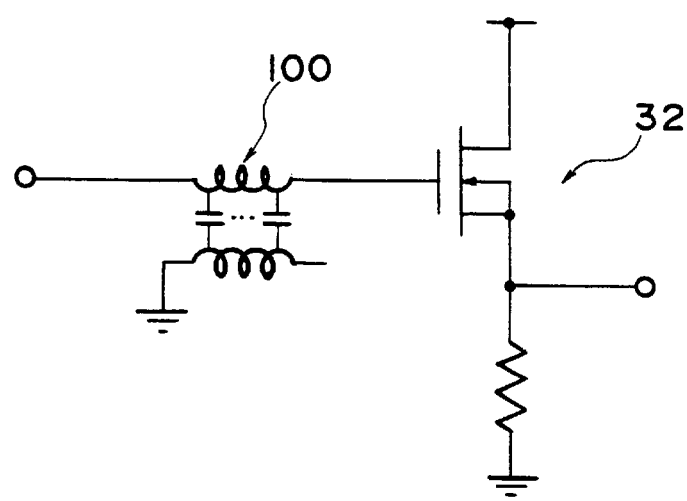
FIGS. 35A–35C are schematic diagrams showing examples of buffer circuit connection to the output side of the LC elements of each embodiment.
Figure 35B:
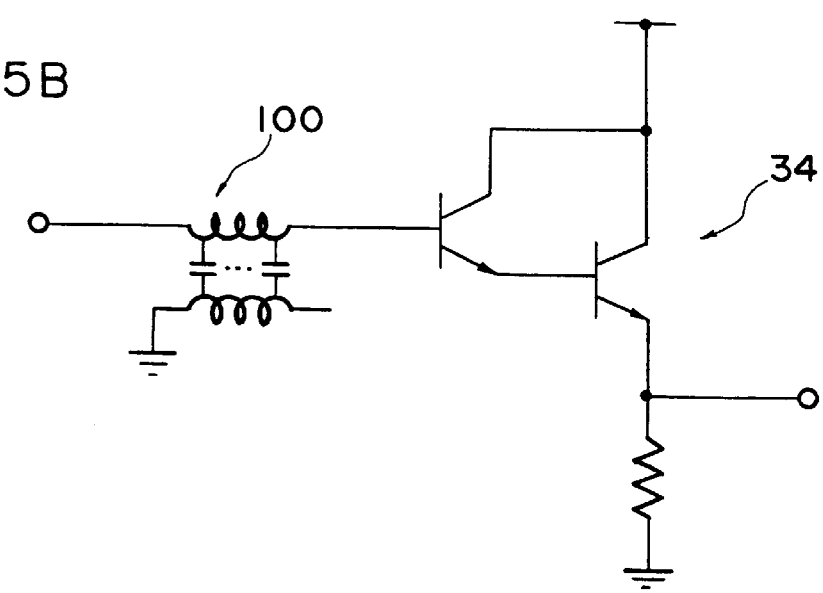
Figure 35C:
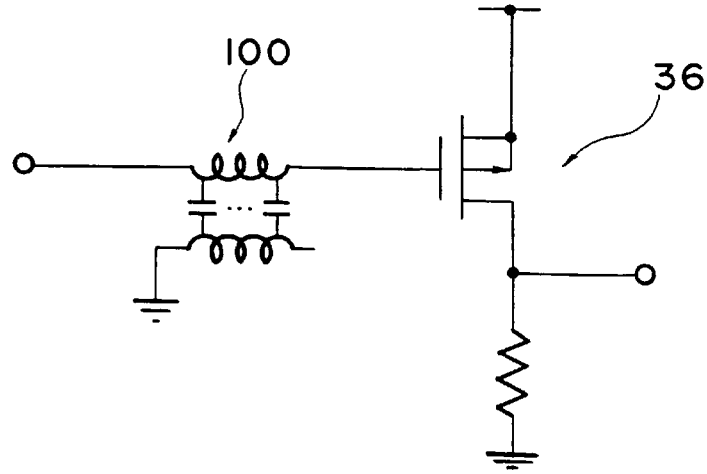

FIGS. 35A, 35B and 35C indicate examples of buffer connection to the output side. FIG. 35A indicates a case of using a source-follower 32 comprising a MOSFET and a resistor as a buffer. Since the MOSFET comprising this source-follower 32 has the same MOS construction as the LC elements of the above mentioned embodiments, the overall LC element can be formed so as to include this source-follower 32 in unitized form.

Also, FIG. 35B indicates a case of using an emitter-follower 34 comprising two bipolar transistors in a Darlington connection and a resistor as a buffer. Since construction of the LC elements of the above embodiments and bipolar transistors differ only slightly, they can be formed on the same semiconductor substrate, and the overall LC element can be formed so as to include this emitter-follower 34 in unitized form. The operating point of the transistor closer to the output can be further stabilized by grounding the base of the transistor via a resistor.

FIG. 35C indicates another buffer circuit using a p-channel MOSFET with reverse bias.

Figure 36A:
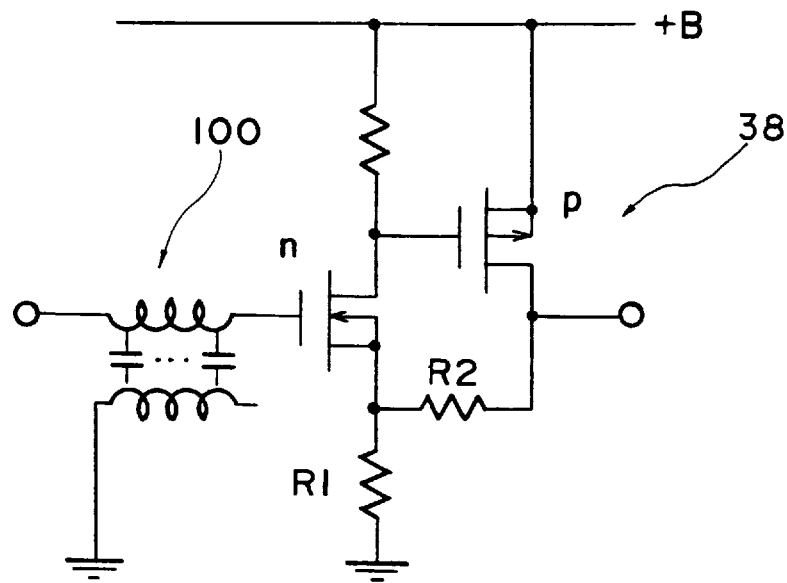
FIGS. 36A and 36B are schematic diagrams showing examples of amplifier circuit connection to the output side of the LC elements of each embodiment.
Figure 36B:
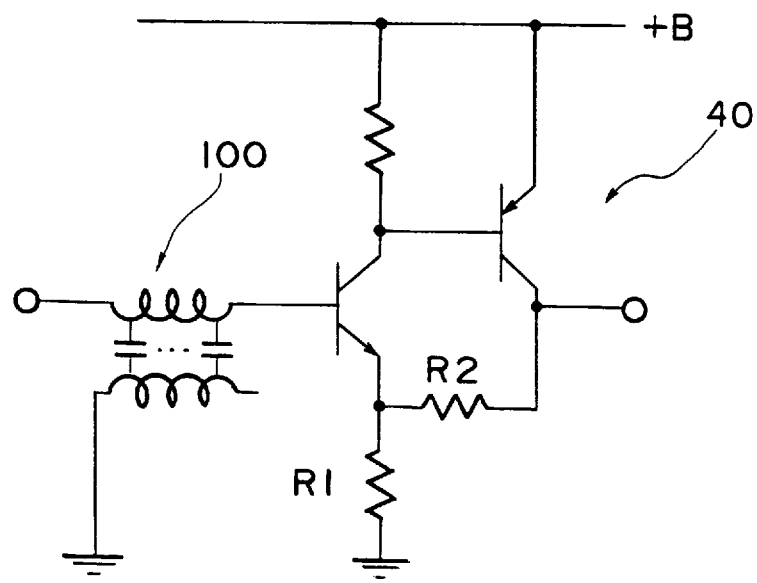

FIGS. 36A and 36B indicate examples of amplifier circuit connection to the output side. FIG. 36A indicates a case of using an amplifier circuit 38 comprising two MOSFETS and resistors as buffers. Since the MOSFETs comprising this amplifier circuit also have the same MOS construction as the LC elements of the above embodiments, the overall LC element can be formed so as to include this amplifier circuit 38 in unitized form. The amplification factor of this circuit is 1+(R2/R1) and by using R2=0, the equivalent of a source-follower is obtained.

Also, FIG. 36B indicates a case of using an amplifier circuit 40 comprising two bipolar transistors and resistors. Since construction of the LC elements of the above embodiments and bipolar transistors differ only slightly, they can be formed on the same semiconductor substrate, and the overall LC element can be formed so as to include this amplifier circuit 40 in unitized form. The amplification factor of this circuit is 1+(R2/R1) and by using R2=0, the equivalent of a source-follower is obtained.

In this manner, by providing amplifier circuits at the output side, a signal attenuated by the LC element 100 etc. inductor component (channel 22) can be restored by amplifying, an output signal with excellent SN ratio can be obtained, and impedance can be matched to following stage circuits.

Also, by connecting a level converter circuit to the output side, a signal level attenuated by the LC element 100 etc. inductor component can be converted or compensated. These level converter circuits can be provided in unitized form with the LC element 100 etc. on the same substrate, similar to the above mentioned buffers.

Figure 37A:
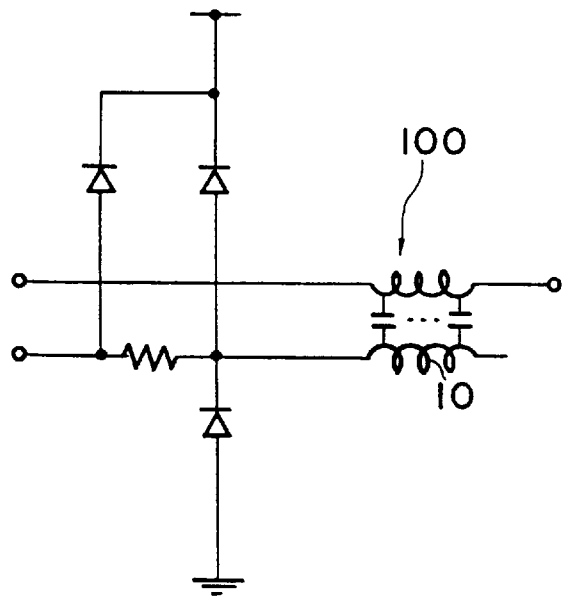
FIGS. 37A and 37B are schematic diagrams showing examples of protector circuit addition to the input side of the LC elements of each embodiment.
Figure 37B:
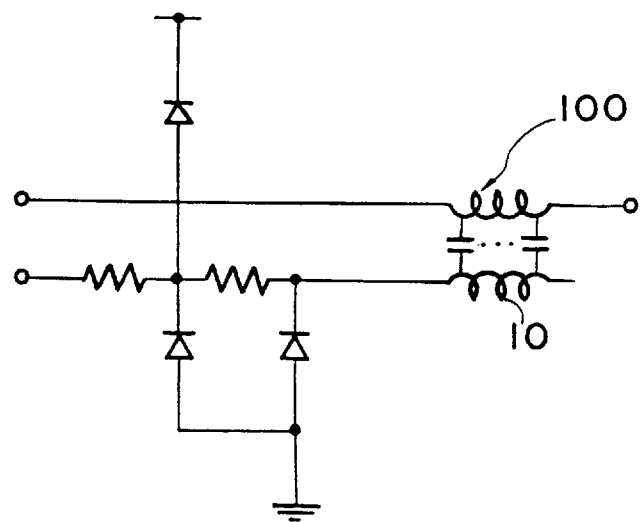

FIGS. 37A and 37B show examples of construction when adding input protector circuits to the LC elements of the above mentioned embodiments. In the case of LC elements having MOS construction, in event high voltage produced, for example, by static electricity is applied to the ground electrode 16 etc. provided at one end of the spiral shaped gate electrode 10, the insulation layer 26 (gate film) between the spiral shaped gate electrode 10 and p-Si substrate 30 can be destroyed. Consequently, a protector circuit is required in order to prevent destruction of the insulation layer 26 by static electricity and the like.

Both the protector circuits indicated in FIGS. 37A and 37B comprise pluralities of diodes and resistors. When high voltage is applied to the gate electrode 10, the current is bypassed to the operating power supply line or chassis ground. Particularly, the FIG. 37A circuit can withstand several hundred electrostatic volts, while the FIG. 37B circuit can withstand 1000–2000 V. The appropriate protector circuit can be selected according to the usage environment and other conditions.

In regard to the above embodiments of this invention, when the channel is used as the signal transmission line, by controlling the gate voltage, the signal transmission line can be set to extremely high impedance. By utilizing this property of the LC elements of this invention, the LC element can be electrically separated from the previous and subsequent stage circuits. For example, in a case when the LC element is inserted into a data line using the channel as the signal transmission line, the data logic input to this transfer route can be output directly, or by setting this transfer route to high resistance, the transfer route output terminal can be held at high impedance. In other words, by inserting the above mentioned LC element into a data line, the function as a tristate buffer can be obtained.

In addition, this invention is not limited to the above mentioned embodiments, but numerous variations are possible within the range of the scope of this invention.

For example, in regard to the above embodiments, the effects of forming the LC element etc. as a portion of an LSI or other device were mentioned, but formation as a portion of an LSI or other device is not essential. After forming the LC element 100 etc. on the semiconductor substrate, providing respective terminals for the ground electrode 16 and input/output electrodes 18 and 20, or utilizing a chemical liquid phase process such as indicated in FIG. 33 to provide the terminals, forming as a discrete element is also acceptable. In this case, by forming a plurality of LC elements on the same semiconductor substrate, then afterwards cutting the semiconductor substrate and providing terminals to the LC elements, easy mass production is enabled.

Also, although forming the gate electrode of aluminum or other metal was described in the above mentioned embodiments, provided that conductivity is adequate, this is not limited to metal, for example, the gate electrode may be formed of polysilicon or other material.

Also, in regard to the above mentioned embodiments, although providing the ground electrode 16 at one end of the spiral shaped gate electrode 10 was mentioned, this need not be at the absolute end. After checking the frequency characteristics, the position can be shifted as required.

Also, although the LC elements of the above mentioned embodiments were formed using a p-Si substrate 30, in the same manner, these can also be formed using an n type semiconductor substrate (n-Si substrate). Also, the semiconductor substrate can comprise material other than silicon, for example, materials such as germanium or non-crystalline amorphous silicon can also be used.

What is claimed is:

1. An LC element manufacturing method comprising:

providing a semiconductor substrate;

forming a first diffusion region and a second diffusion region in the semiconductor substrate;

forming an insulation layer over the semiconductor substrate;

forming a gate electrode into one of a spiral, a meander, an arc, a sinusoidal and a circular shape to produce a signal transmission line having a distributed inductance and a distributed capacitance relative to the semiconductor substrate for transmission of signals, the gate electrode being formed over the insulation layer, the gate electrode being formed over at least a portion of the first and second diffusion regions; and forming wires over the semiconductor substrate electrically connected to the first and second diffusion regions.

2. An LC element manufacturing method comprising:

providing a semiconductor substrate;

forming a diffusion region in the semiconductor substrate;

forming an insulation layer over the semiconductor substrate;

forming a gate electrode into one of a spiral, a meander, an arc, a sinusoidal and a circular shape to produce a signal transmission line having a distributed inductance and a distributed capacitance relative to the semiconductor substrate for transmission of signals, the gate electrode being formed over the insulation layer, the gate electrode being formed over at least a portion of the diffusion region; and forming wires over the semiconductor substrate electrically connected to the signal transmission line gate electrode and the diffusion region.

3. The method of claim 1, wherein signals to be transmitted over the signal transmission line is connected to at least one of the gate electrode, a channel, and the gate electrode and the channel.

4. The method of claim 2, wherein signals to be transmitted over the signal transmission line is connected to at least one of the gate electrode, a channel, and the gate electrode and the channel.

5. An LC element manufacturing method comprising:

providing a semiconductor substrate;

forming a first diffusion region and a second diffusion region in the semiconductor substrate;

forming an insulation layer over the semiconductor substrate;

forming a gate electrode transmission line include the gate electrode, the gate into one of a spiral, a meander, an arc, a sinusoidal and a circular shape to produce a signal transmission line having a distributed inductance and a distributed capacitance relative to the semiconductor substrate for transmission of signals, the gate electrode having a length and a width being formed over the insulation layer, wherein the length is far greater than the width, the gate electrode being formed over at least a portion of the first and second diffusion regions; and forming wires over the semiconductor substrate electrically connected to the first and second diffusion regions.

* * * * *